US012813053B2

(12) United States Patent
An et al.

(10) Patent No.: US 12,813,053 B2
(45) Date of Patent: Nov. 24, 2026

(54) DISPLAY DEVICE

(71) Applicants: LG ELECTRONICS INC., Seoul (KR); LG DISPLAY CO., LTD., Seoul (KR)

(72) Inventors: Jaeyong An, Seoul (KR); Yangwoo Byun, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 307 days.

(21) Appl. No.: 18/727,264

(22) PCT Filed: Jan. 14, 2022

(86) PCT No.: PCT/KR2022/000763
§ 371 (c)(1),
(2) Date: Jul. 8, 2024

(87) PCT Pub. No.: WO2023/136378
PCT Pub. Date: Jul. 20, 2023

(65) Prior Publication Data
US 2025/0081696 A1 Mar. 6, 2025

(51) Int. Cl.
*H10H 20/857* (2025.01)
*H10W 90/00* (2026.01)

(52) U.S. Cl.
CPC .......... *H10H 20/857* (2025.01); *H10W 90/00* (2026.01)

(58) Field of Classification Search
CPC ...... H10H 20/857; H10H 29/49; H10H 29/03; H10W 90/00
See application file for complete search history.

(56) References Cited

U.S. PATENT DOCUMENTS 7,719,099 B2 * 5/2010 Tseng ................. H10H 20/8581 257/E33.057
12,243,861 B2 * 3/2025 Kim ..................... H10D 86/021
2013/0334552 A1 * 12/2013 Yang .................. H10H 20/8312 257/98

(Continued)

FOREIGN PATENT DOCUMENTS

KR 10-2019-0085892 7/2019
KR 10-2019-0118992 10/2019

(Continued)

OTHER PUBLICATIONS

Korean Intellectual Property Office Application No. 10-2024-7021469, Office Action dated Aug. 14, 2025, 3 pages.

(Continued)

*Primary Examiner* — John M Parker
(74) *Attorney, Agent, or Firm* — LEE, HONG, DEGERMAN, KANG & WAIMEY

(57) ABSTRACT

The display device can include a substrate, a first assembling wiring on the substrate, a second assembling wiring on the first assembling wiring, an insulating layer between the first assembling wiring and the second assembling wiring, a partition wall disposed on the second assembling wiring and having an assembly hole, and a semiconductor light-emitting device in the assembly hole. A part of the second assembling wiring can be disposed at a center of the assembly hole, and a width of a part of the second assembling wiring can be smaller than a diameter of the assembly hole.

19 Claims, 20 Drawing Sheets

302

(56) References Cited

U.S. PATENT DOCUMENTS

| | | | | |
|---|---|---|---|---|
| 2019/0326144 | A1 | 10/2019 | Shim et al. | |
| 2020/0395345 | A1* | 12/2020 | Park | H10H 20/01 |
| 2022/0068876 | A1 | 3/2022 | Do et al. | |
| 2022/0351993 | A1 | 11/2022 | Jeong et al. | |
| 2022/0367757 | A1 | 11/2022 | Moon et al. | |
| 2022/0415859 | A1 | 12/2022 | Choi et al. | |
| 2023/0005887 | A1 | 1/2023 | Kwon et al. | |
| 2023/0059135 | A1 | 2/2023 | Chang et al. | |
| 2023/0110862 | A1 | 4/2023 | Kim et al. | |
| 2023/0126933 | A1 | 4/2023 | An et al. | |
| 2023/0207608 | A1 | 6/2023 | Kim et al. | |
| 2024/0363818 | A1 | 10/2024 | Kwon et al. | |

FOREIGN PATENT DOCUMENTS

| | | |
|---|---|---|
| KR | 10-2019-0143840 | 12/2019 |
| KR | 10-2020-0026681 | 3/2020 |
| KR | 10-2020-0026775 | 3/2020 |
| KR | 10-2020-0026845 | 3/2020 |
| KR | 10-2020-0088949 | 7/2020 |
| KR | 10-2021-0135383 | 11/2021 |
| KR | 10-2024-0051274 | 4/2024 |
| WO | 2023-277215 | 1/2023 |

OTHER PUBLICATIONS

PCT International Application No. PCT/KR2022/000763, International Search Report dated Oct. 11, 2022, 4 pages.

Korean Intellectual Property Office Application No. 10-2024-7021469, Notice of Allowance dated Apr. 21, 2026, 8 pages.

* cited by examiner

DISPLAY DEVICE

CROSS-REFERENCE TO RELATED APPLICATION(S)

This application is the National Stage filing under 35 U.S.C. 371 of International Application No. PCT/KR2022/000763, filed on Jan. 14, 2022, the contents of which is hereby incorporated by reference herein in its entirety.

BACKGROUND OF THE DISCLOSURE

Field

The embodiment relates to a display device.

Discussion of the Related Art

Large-area displays include liquid crystal displays (LCDs), OLED displays, and micro-LED displays.

The micro-LED display may be a display that uses micro-LEDs, which are semiconductor light-emitting devices with a diameter or cross-sectional area of 100 μm or less, as display elements.

Since a micro-LED display uses micro-LEDs, which are semiconductor light-emitting devices, as display elements, it has excellent performance in many characteristics such as contrast ratio, response speed, color reproducibility, viewing angle, brightness, resolution, lifespan, luminous efficiency, or luminance.

In particular, the micro-LED display has the advantage of being able to freely adjust the size or resolution and implement a flexible display because the screen can be separated and combined in a modular manner.

However, since a large-area micro-LED display requires millions or more micro-LEDs, there is a technical problem that it is difficult to quickly and accurately transfer micro-LEDs to a display panel.

Recently developed transfer technologies include the pick and place process, the laser lift-off method, and the self-assembly method.

Among these, the self-assembly method is advantageous for implementing large-screen display devices as it is a method in which semiconductor light-emitting devices find their own assembly positions within a fluid.

However, research on the technology for manufacturing displays through self-assembly of micro-LEDs is still insufficient.

In particular, in the conventional technology, when transferring millions or more semiconductor light-emitting devices to a large display quickly, the transfer speed can be improved, but the transfer error rate can increase, which causes a technical problem in that the transfer yield is low.

In the related technology, a self-assembly type transfer process using dielectrophoretic (DEP) force is being attempted, but there is a problem in that the self-assembly rate is low due to the unevenness of the DEP force.

On the other hand, according to the non-public internal technology, DEP force is required for self-assembly, but due to the difficulty in uniform control of DEP force, there is a problem that the semiconductor light-emitting device is tilted to a place other than the normal position in the assembly hole when assembling using self-assembly.

In addition, due to the tilting phenomenon of the semiconductor light-emitting device, there is a problem that the electrical contact characteristics are deteriorated in the subsequent electrical contact process, resulting in a lower lighting rate.

Therefore, according to the non-public internal technology, DEP force is required for self-assembly, but when using DEP force, there is a technical contradiction that the electrical contact characteristics are deteriorated due to the tilting phenomenon of the semiconductor light-emitting device.

SUMMARY OF THE DISCLOSURE

An object of the embodiment is to solve the foregoing and other problems.

Another object of the embodiment is to provide a display device capable of improving the self-assembly rate and assembly yield.

In addition, another object of the embodiment is to provide a display device capable of improving the lighting rate by preventing electrical contact failure on the lower side of the semiconductor light-emitting device.

In addition, another object of the embodiment is to provide a display device capable of securing a uniform lighting rate between each pixel or each sub-pixel.

The technical problems of the embodiments are not limited to those described in this item and include those that can be understood through the description of the invention.

According to one aspect of the embodiment, in order to achieve the above or other objects, a display device, comprising: a substrate; a first assembling wiring on the substrate; a second assembling wiring on the first assembling wiring; an insulating layer between the first assembling wiring and the second assembling wiring; a partition wall disposed on the second assembling wiring and having an assembly hole; and a semiconductor light-emitting device in the assembly hole, wherein a part of the second assembling wiring is disposed at a center of the assembly hole, and wherein a width of a part of the second assembling wiring is smaller than a diameter of the assembly hole.

The assembly hole may comprise a first hole region in which the second assembling wiring vertically overlaps the first assembling wiring; and a second hole region in which the second assembling wiring does not vertically overlap the second assembling wiring.

The first assembling wiring may comprise a first bus wiring disposed along a first direction; and a first branch electrode extending from the first bus wiring along a second direction, the second assembling wiring may comprise a second bus wiring disposed along the first direction and spaced apart from the first bus wiring; and a second branch electrode extending from the second bus wiring toward the first bus wiring along the second direction.

The second branch electrode may vertically overlap the first branch electrode in the first hole region and may not vertically overlap the first branch electrode in the second hole region.

The second branch electrode may comprise a bar electrode disposed across the center of the assembly hole along the second direction.

The second branch electrode may comprise an auxiliary electrode disposed at the center of the assembly hole, having a diameter greater than a width of the bar electrode, and having a circular shape.

The second branch electrode may comprise an auxiliary electrode disposed along the first direction by intersecting the bar electrode at the center of the assembly hole, having a width greater than a width of the bar electrode, and having a polygonal shape.

The second branch electrode may comprise a first auxiliary electrode positioned at a first distance from the second bus wiring by intersecting with the bar electrode, and having a width greater than a width of the bar electrode; and a second auxiliary electrode positioned at a second distance from the first bus wiring by intersecting with the bar electrode, and having a width greater than a width of the bar electrode.

The second branch electrode may comprise a first bar electrode extending from the center of the assembly hole toward the second bus wiring; a second bar electrode extending in a third direction from the center of the assembly hole; and a third bar electrode extending in a fourth direction from the center of the assembly hole.

A width of the first branch electrode may be at least greater than the diameter of the assembly hole, and a width of the second branch electrode may be smaller than the diameter of the assembly hole.

As shown in FIGS. 9 to 11, the width t1 of the first branch electrode 212 may be greater than the diameter D11 of the assembly hole 207H, and the width t2 of the second branch electrode 222 may be smaller than the diameter D11 of the assembly hole 207H. Accordingly, the assembly hole 207H may comprise a first hole region 207*a* in which the second branch electrode 222 vertically overlaps the first branch electrode 212, and a second hole region 207*b* in which the second branch electrode 222 does not vertically overlap the first branch electrode 212. When an AC voltage (V1 of FIG. 13*a*) is applied to the first branch electrode 212 and the second branch electrode 222 for self-assembly, a first DEP force and a second DEP force may be formed in the second hole region 207*b* located on both sides of the second branch electrode 222 based on the second branch electrode 222. At this time, the second branch electrode 222 may comprise a bar electrode 222*m* disposed across the center of the assembly hole 207H.

Therefore, since the distance d1 between the bar electrode 222*m* and the first inner side 231 of the assembly hole 207H is the same as the distance d2 between the bar electrode 222*m* and the second inner side 232 of the assembly hole 207H, the first DEP force formed in the first hole region 207*a* and the second DEP force formed in the second hole region 207*b* are the same. Accordingly, during self-assembly, the semiconductor light-emitting device inserted into the assembly hole 207H may not be biased toward one side of the assembly hole 207H, for example, the first inner side 231 or the second inner side 232, and its center may be positioned at the center of the assembly hole 207H or the center of the second branch electrode 222. That is, the semiconductor light-emitting device 150 may be positioned correctly within the assembly hole 207H and fixed by the first DEP force and the second DEP force. Since the semiconductor light-emitting device 150 is fixed within the assembly hole 207H by the first DEP force and the second DEP force, it does not fall out of the assembly hole 207H after the self-assembly process is completed or completed, so that the self-assembly rate and assembly yield can be significantly improved.

Meanwhile, the second branch electrode 222 used as the lower electrode wiring can be disposed in the center of the assembly hole 207H, and the lower surface of the semiconductor light-emitting device 150 can directly contact the upper surface of the second branch electrode 222. In this case, even if the semiconductor light-emitting device 150 is biased to one side within the assembly hole 207H, the entire area of the second branch electrode 222 can contact the lower surface of the semiconductor light-emitting device 150. Accordingly, since poor electrical contact between the semiconductor light-emitting device 150 and the second branch electrode 222 in each of the plurality of sub-pixels of each of the plurality of pixels is prevented, the lighting rate can be significantly improved. In addition, since the contact area between the semiconductor light-emitting device 150 and the second branch electrode 222 in each of the plurality of sub-pixels of each of the plurality of pixels is the same, a uniform lighting rate can be secured between the plurality of pixels or between the plurality of sub-pixels.

Meanwhile, since the width t2 of the second branch electrode 222 is relatively small compared to the diameter of the semiconductor light-emitting device 150, when the semiconductor light-emitting device 150 is properly positioned in the assembly hole 207H, it is difficult to support it on the narrow width t2 of the second branch electrode 222, so that the semiconductor light-emitting device 150 may shake left and right on the second branch electrode 222 and eventually be tilted to one side.

The embodiment can prevent one-sided tilting due to left-right shaking of the semiconductor light-emitting device 150 by disposing various auxiliary electrodes (222*a* of FIGS. 15 and 17, 222*a*1 and 222*a*2 of FIG. 18, and 222*al* to 222*a*3 of FIG. 19) intersecting the bar electrode 222*m* of the second branch electrode 222, thereby positioning the semiconductor light-emitting device 150 correctly.

Additional scope of applicability of the embodiments will become apparent from the detailed description that follows. However, since various changes and modifications within the spirit and scope of the embodiments may be clearly understood by those skilled in the art, the detailed description and specific embodiments, such as preferred embodiments, should be understood as being given by way of example only.

Figure 1:
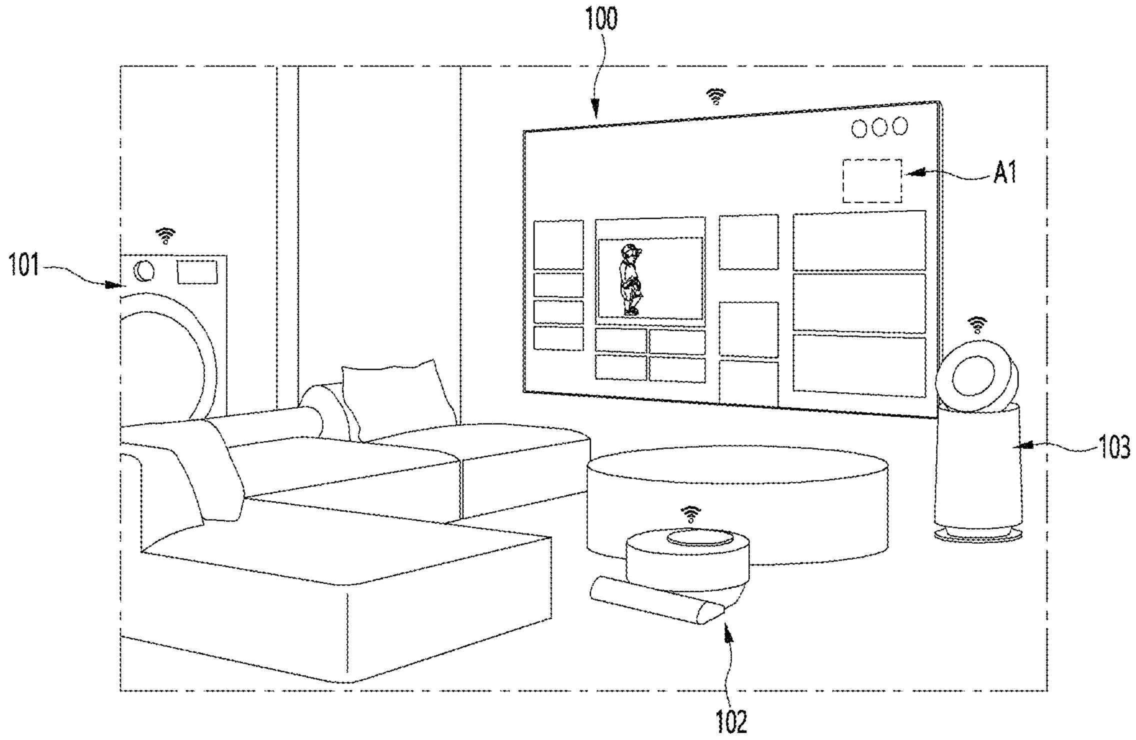
FIG. 1 illustrates a living room of a house in which a display device according to an embodiment is disposed.

The sizes, shapes, dimensions, etc. of elements shown in the drawings can differ from actual ones. In addition, even if the same elements are shown in different sizes, shapes, dimensions, etc. between the drawings, this is only an example on the drawing, and the same elements have the same sizes, shapes, dimensions, etc. between the drawings.

DETAILED DESCRIPTION OF EMBODIMENTS

Hereinafter, the embodiment disclosed in this specification will be described in detail with reference to the accompanying drawings, but the same or similar elements are given the same reference numerals regardless of reference numerals, and redundant descriptions thereof will be omitted. The suffixes 'module' and 'unit' for the elements used in the following descriptions are given or used interchangeably in consideration of ease of writing the specification, and do not themselves have a meaning or role that is distinct from each other. In addition, the accompanying drawings are for easy understanding of the embodiment disclosed in this specification, and the technical idea disclosed in this specification is not limited by the accompanying drawings. Also, when an element such as a layer, region or substrate is referred to as being 'on' another element, this means that there can be directly on the other element or be other intermediate elements therebetween.

The display device described in this specification may comprise a TV, a signage, a mobile phone, a smart phone, a head-up display (HUD) for a car, a backlight unit for a laptop computer, a display for VR or AR, etc. However, the configuration according to the embodiment described in this specification may also be applied to a device capable of displaying, even if it is a new product type developed in the future.

The following describes a light-emitting device according to an embodiment and a display device including the same.

FIG. 1 illustrates a living room of a house in which a display device according to an embodiment is disposed.

Referring to FIG. 1, the display device 100 of the embodiment can display the status of various electronic products such as a washing machine 101, a robot vacuum cleaner 102, and an air purifier 103, and can communicate with each electronic product based on IOT and control each electronic product based on the user's setting data.

The display device 100 according to the embodiment may comprise a flexible display manufactured on a thin and flexible substrate. The flexible display may be bent or rolled like paper while maintaining the characteristics of the existing flat panel display.

In the flexible display, visual information may be implemented by independently controlling the light emission of unit pixels disposed in a matrix form. A unit pixel means a minimum unit for implementing one color. The unit pixel of the flexible display may be implemented by a light-emitting device. In the embodiment, the light-emitting device may be a Micro-LED or a Nano-LED, but is not limited thereto.

Figure 2:
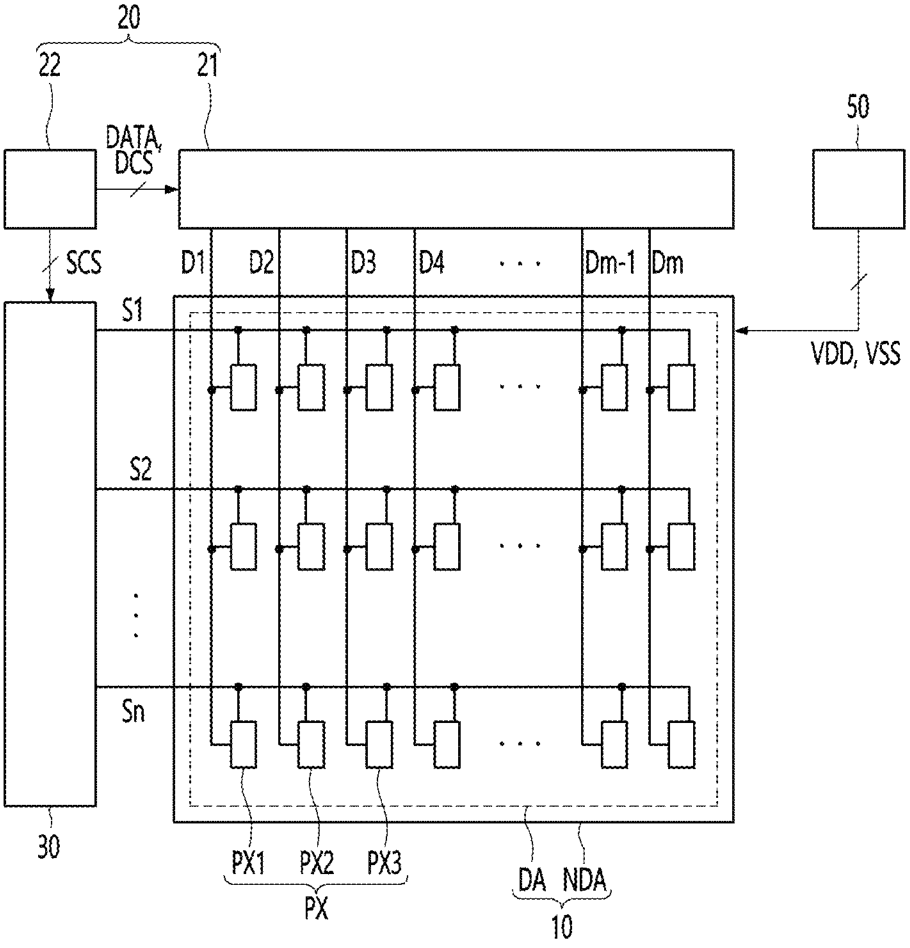
FIG. 2 is a block diagram schematically showing a display device according to an embodiment.
Figure 3:
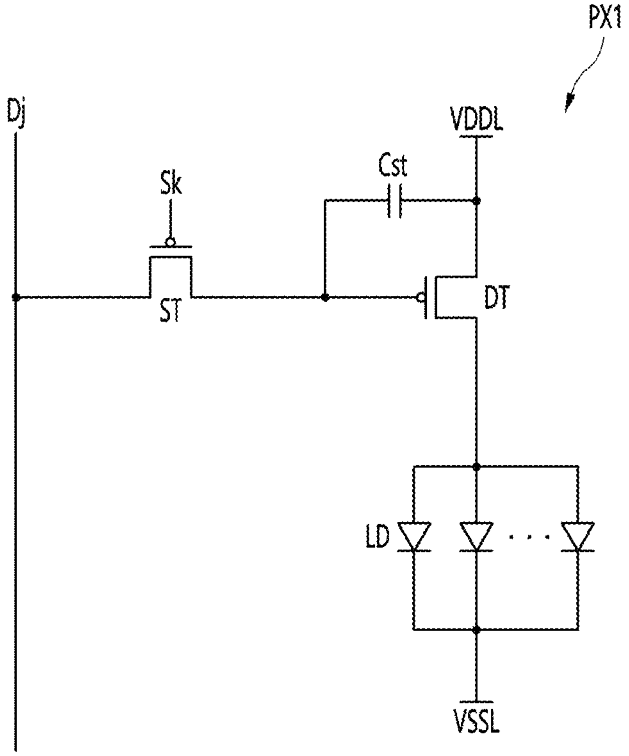
FIG. 3 is a circuit diagram showing an example of a pixel of FIG. 2.

FIG. 2 is a block diagram schematically showing a display device according to the embodiment, and FIG. 3 is a circuit diagram showing an example of a pixel of FIG. 2.

Referring to FIGS. 2 and 3, the display device according to the embodiment may comprise a display panel 10, a driving circuit 20, a scan driving circuit 30, and a power supply circuit 50.

The display device 100 of the embodiment can drive the light-emitting device in an active matrix (AM) method or a passive matrix (PM) method.

The driving circuit 20 may comprise a data driving circuit 21 and a timing controller 22.

The display panel 10 can be formed in a rectangular shape, but is not limited thereto. That is, the display panel 10 can be formed in a circular or oval shape. At least one side of the display panel 10 can be formed to be bent at a predetermined curvature.

The display panel 10 can be divided into a display area DA and a non-display area NDA disposed around the display area DA. The display area DA is an area where pixels PX are formed to display an image. The display panel 10 may comprise data lines (D1 to Dm, where m is an integer greater than or equal to 2), scan lines (S1 to Sn, where n is an integer greater than or equal to 2) intersecting the data lines D1 to Dm, a high-potential voltage line VDDL supplied with a high-potential voltage, a low-potential voltage line VSSL supplied with a low-potential voltage, and pixels PX connected to the data lines D1 to Dm and the scan lines S1 to Sn.

Each of the pixels PX may comprise a first sub-pixel PX1, a second sub-pixel PX2, and a third sub-pixel PX3. The first sub-pixel PX1 may emit a first color light of a first main wavelength, the second sub-pixel PX2 may emit a second color light of a second main wavelength, and the third sub-pixel PX3 may emit a third color light of a third main wavelength. The first color light may be red light, the second color light may be green light, and the third color light may be blue light, but is not limited thereto. In addition, although FIG. 2 exemplifies that each of the pixels PX includes three sub-pixels, the present invention is not limited thereto. That is, each of the pixels PX may comprise four or more sub-pixels.

Each of the first sub-pixel PX1, the second sub-pixel PX2, and the third sub-pixel PX3 may be connected to at least one of the data lines D1 to Dm, at least one of the scan lines S1 to Sn, and the high-potential voltage line VDDL. The first sub-pixel PX1 may comprise light-emitting devices LDs, a plurality of transistors for supplying current to the light-emitting devices LDs, and at least one capacitor Cst, as shown in FIG. 3.

Although not shown in the drawing, each of the first sub-pixel PX1, the second sub-pixel PX2, and the third sub-pixel PX3 may comprise only one light-emitting device LD and at least one capacitor Cst.

Each of the light-emitting devices LDs may be a semiconductor light-emitting diode comprising a first electrode, a plurality of conductivity type semiconductor layers, and a second electrode. Here, the first electrode may be an anode electrode, and the second electrode may be a cathode electrode, but is not limited thereto.

The light-emitting device LD may be one of a lateral-type light-emitting device, a flip-chip light-emitting device, and a vertical-type light-emitting device.

The plurality of transistors may comprise a driving transistor DT for supplying current to the light-emitting devices LDs, and a scan transistor ST for supplying a data voltage to a gate electrode of the driving transistor DT, as shown in FIG. 3. The driving transistor DT may comprise a gate electrode connected to a source electrode of the scan transistor ST, a source electrode connected to a high-potential voltage line VDDL to which a high-potential voltage is applied, and a drain electrode connected to the first electrodes of the light-emitting devices LDs. The scan transistor ST may comprise a gate electrode connected to a scan line (Sk, where k is an integer satisfying $1 \leq k \leq n$), a source electrode connected to a gate electrode of the driving transistor DT, and a drain electrode connected to a data line (Dj, where j is an integer satisfying $1 \leq j \leq m$).

A capacitor Cst is formed between the gate electrode and the source electrode of the driving transistor DT. The storage capacitor Cst charges a difference value between the gate voltage and the source voltage of the driving transistor DT.

The driving transistor DT and the scan transistor ST may be formed as thin film transistors. In addition, although FIG. 3 has described the driving transistor DT and the scan transistor ST as being formed as P-type metal oxide semiconductor field effect transistors (MOSFETs), the present invention is not limited thereto. The driving transistor DT and the scan transistor ST may also be formed as N-type MOSFETs. In this case, the positions of the source electrodes and the drain electrodes of each of the driving transistor DT and the scan transistor ST may be changed.

In addition, in FIG. 3, the first sub-pixel PX1, the second sub-pixel PX2, and the third sub-pixel PX3 are exemplified as comprising 2T1C (2 Transistor-1 capacitor) having one driving transistor DT, one scan transistor ST, and one capacitor Cst, but the present invention is not limited thereto. The first sub-pixel PX1, the second sub-pixel PX2, and the third sub-pixel PX3 may each include a plurality of scan transistors STs and a plurality of capacitors Csts.

The second sub-pixel PX2 and the third sub-pixel PX3 can be expressed by substantially the same circuit diagram as the first sub-pixel PX1, so a detailed description thereof is omitted.

The driving circuit 20 outputs signals and voltages for driving the display panel 10. To this end, the driving circuit 20 may comprise a data driving circuit 21 and a timing controller 22.

The data driving circuit 21 receives digital video data DATA and a source control signal DCS from the timing controller 22. The data driving circuit 21 converts the digital video data DATA into analog data voltages according to the source control signal DCS and supplies the analog data voltages to the data lines D1 to Dm of the display panel 10.

The timing controller 22 receives digital video data DATA and timing signals from the host system. The timing signals may comprise a vertical sync signal, a horizontal sync signal, a data enable signal, and a dot clock. The host system may be an application processor of a smartphone or tablet PC, a monitor, a system on chip of a TV, etc.

The timing controller 22 generates control signals for controlling the operation timing of the data driving circuit 21 and the scan driving circuit 30. The control signals may comprise a source control signal DCS for controlling the operation timing of the data driving circuit 21 and a scan control signal SCS for controlling the operation timing of the scan driving circuit 30.

The driving circuit 20 may be disposed in a non-display area NDA provided on one side of the display panel 10. The driving circuit 20 may be formed as an integrated circuit (IC) and mounted on the display panel 10 using a chip on glass (COG) method, a chip on plastic (COP) method, or an ultrasonic bonding method, but the present invention is not limited thereto. For example, the driving circuit 20 may be mounted on a circuit board (not shown) other than the display panel 10.

The data driving circuit 21 may be mounted on the display panel 10 using a COG method, a COP method, or an ultrasonic bonding method, and the timing controller 22 may be mounted on the circuit board.

The scan driving circuit 30 receives a scan control signal SCS from the timing controller 22. The scan driving circuit 30 generates scan signals according to the scan control signal SCS and supplies the scan signals to the scan lines S1 to Sn of the display panel 10. The scan driving circuit 30 may comprise a plurality of transistors and may be formed in a non-display area NDA of the display panel 10. Alternatively, the scan driving circuit 30 may be formed as an integrated circuit, in which case it may be mounted on a gate flexible film attached to the other side of the display panel 10.

The circuit board may be attached to pads provided at one edge of the display panel 10 using an anisotropic conductive film. As a result, lead lines of the circuit board may be electrically connected to the pads. The circuit board may be a flexible printed circuit board, a printed circuit board, or a flexible film such as a chip on film. The circuit board may be bent to the bottom of the display panel 10. As a result, one side of the circuit board may be attached to one edge of the display panel 10, and the other side may be disposed at the bottom of the display panel 10 and connected to a system board on which a host system is mounted.

The power supply circuit 50 may generate voltages necessary for driving the display panel 10 from a main power applied from the system board and supply the voltages to the display panel 10. For example, the power supply circuit 50 can generate a high-potential voltage VDD and a low-potential voltage VSS for driving the light-emitting devices LD of the display panel 10 from the main power supply and supply the a high-potential voltage VDD and the low-potential voltage VSS to the high-potential voltage line VDDL and the low-potential voltage line VSSL of the display panel 10. In addition, the power supply circuit 50 can generate and supply driving voltages for driving the driving circuit 20 and the scan driving circuit 30 from the main power supply.

Figure 4:
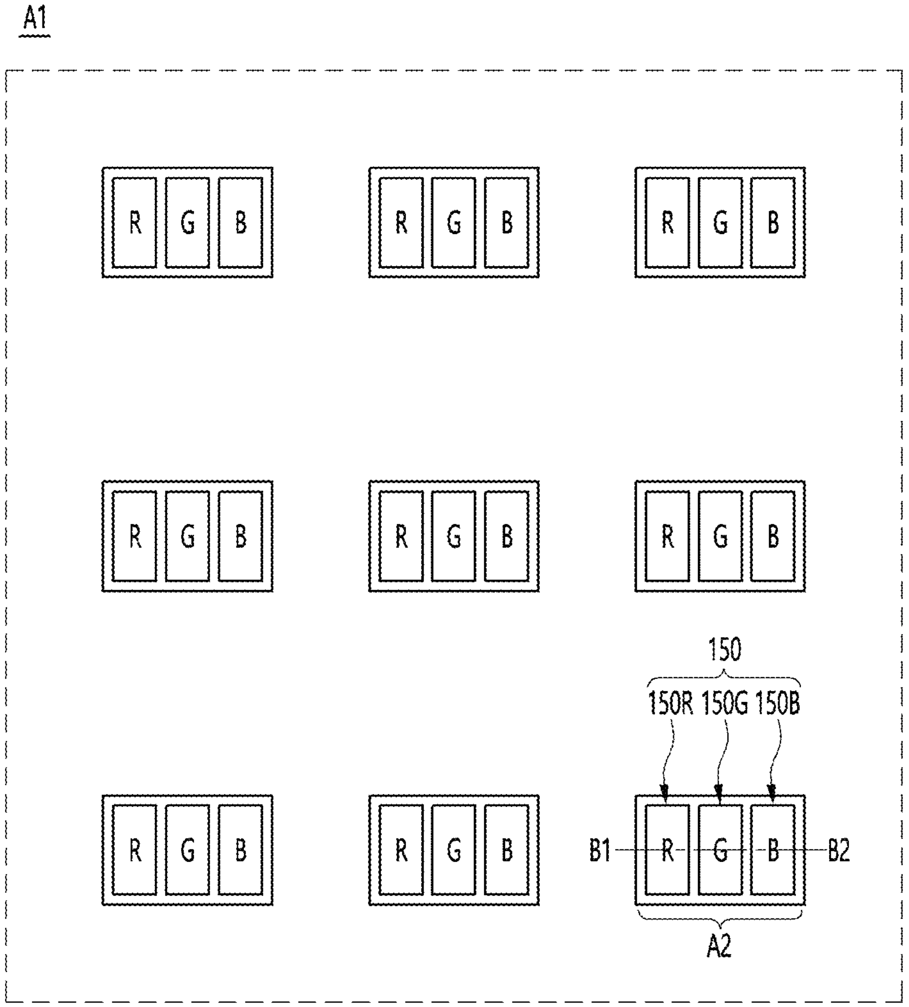
FIG. 4 is an enlarged view of the first panel area in the display device of FIG. 1.

FIG. 4 is an enlarged view of the first panel area in the display device of FIG. 3.

Referring to FIG. 4, the display device 100 of the embodiment can be manufactured by mechanically and electrically connecting a plurality of panel areas such as the first panel area A1 by tiling.

The first panel area A1 may comprise a plurality of semiconductor light-emitting devices 150 disposed for each unit pixel (PX of FIG. 2).

For example, the unit pixel PX may comprise a first sub-pixel PX1, a second sub-pixel PX2, and a third sub-pixel PX3. For example, a plurality of red semiconductor light-emitting devices 150RR may be disposed in the first sub-pixel PX1, a plurality of green semiconductor light-emitting devices 150G may be disposed in the second sub-pixel PX2, and a plurality of blue semiconductor light-emitting devices 150B may be disposed in the third sub-pixel PX3. The unit pixel PX may further include a fourth sub-pixel in which no semiconductor light-emitting devices are disposed, but is not limited thereto.

Figure 5:
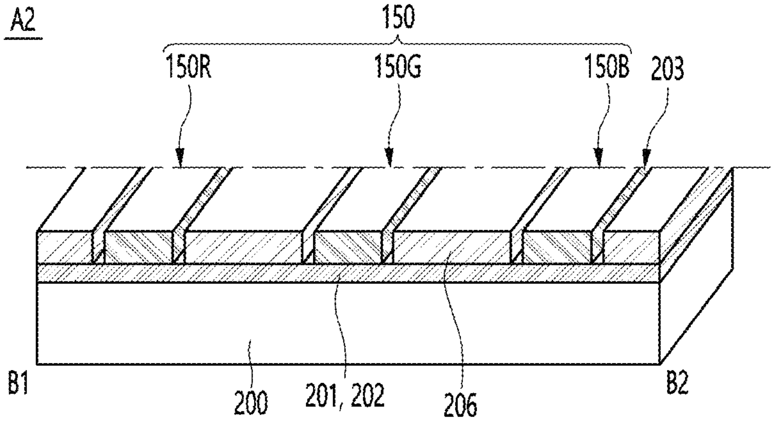
FIG. 5 is an enlarged view of the A2 area in FIG. 4.

FIG. 5 is an enlarged view of the A2 region of FIG. 4.

Referring to FIG. 5, the display device 100 of the embodiment may comprise a substrate 200, assembling wirings 201 and 202, an insulating layer 206, and a plurality of semiconductor light-emitting devices 150. More components may be included.

The assembling wiring may comprise a first assembling wiring 201 and a second assembling wiring 202 that are spaced apart from each other. The first assembling wiring 201 and the second assembling wiring 202 may be provided to generate a dielectrophoretic (DEP) force to assemble the semiconductor light-emitting device 150. For example, the semiconductor light-emitting device 150 may be one of a lateral-type semiconductor light-emitting device, a flip-chip type semiconductor light-emitting device, and a vertical-type semiconductor light-emitting device.

The semiconductor light-emitting device 150 may comprise a red semiconductor light-emitting device 150R, a green semiconductor light-emitting device 150G, and a blue semiconductor light-emitting device 150B to form sub-pixels, but is not limited thereto, and may also comprise a red phosphor and a green phosphor to implement red and green, respectively.

The substrate 200 may be a support member that supports components disposed on the substrate 200 or a protective member that protects the components.

The substrate 200 may be a rigid substrate or a flexible substrate. The substrate 200 may be formed of sapphire, glass, silicon, or polyimide. In addition, the substrate 200 may comprise a flexible material such as polyethylene naphthalate (PEN), polyethylene terephthalate (PET). In addition, the substrate 200 may be a transparent material, but is not limited thereto. The substrate 200 may function as a support substrate in a display panel, and may also function as an assembling substrate when self-assembling a light-emitting device.

The substrate 200 may be a backplane equipped with circuits, such as transistors ST and DT, capacitors Cst, and signal wiring, within the sub-pixels PX1, PX2, and PX3 illustrated in FIGS. 2 and 3, but is not limited thereto.

The insulating layer 206 may comprise an organic material having insulation and flexibility, such as polyimide, PAC, PEN, PET, polymer, or an inorganic material, such as silicon oxide $SiO_2$ or silicon nitride series $SiN_x$, and may be formed integrally with the substrate 200 to form a single substrate.

The insulating layer 206 may be a conductive adhesive layer having adhesion and conductivity, and the conductive adhesive layer may have flexibility to enable a flexible function of the display device. For example, the insulating layer 206 may be a conductive adhesive layer such as an anisotropic conductive film (ACF) or an anisotropic conductive medium, a solution containing conductive particles, etc. The conductive adhesive layer may be a layer that is electrically conductive in a direction vertical to the thickness, or electrically insulating in a direction horizontal to the thickness.

The insulating layer 206 may comprise an assembly hole 203 for inserting a semiconductor light-emitting device 150. Therefore, when self-assembling, the semiconductor light-emitting device 150 can be easily inserted into the assembly hole 203 of the insulating layer 206. The assembly hole 203 may be referred to an insertion hole, a fixing hole, an alignment hole, etc. The assembly hole 203 may also be referred to a hole.

The assembly hole 203 may be referred to as a hole, a dent, a groove, a recess, a pocket, etc.

The assembly hole 203 may be different depending on the shape of the semiconductor light-emitting device 150. For example, the red semiconductor light-emitting device, the green semiconductor light-emitting device, and the blue semiconductor light-emitting device each have different shapes, and may have an assembly hole 203 having a shape corresponding to the shape of each of these semiconductor light-emitting devices. For example, the assembly hole 203 may comprise a first assembly hole for assembling the red semiconductor light-emitting device, a second assembly hole for assembling the green semiconductor light-emitting device, and a third assembly hole for assembling the blue semiconductor light-emitting device. For example, the red semiconductor light-emitting device may have a circular shape, the green semiconductor light-emitting device may have a first oval shape having a first minor axis and a second major axis, and the blue semiconductor light-emitting device may have a second oval shape having a second minor axis and a second major axis, but is not limited thereto. The second major axis of the ellipse of the blue semiconductor light-emitting device may be greater than the first major axis of the ellipse of the green semiconductor light-emitting device, and the second minor axis of the ellipse of the blue semiconductor light-emitting device may be smaller than the first minor axis of the ellipse of the green semiconductor light-emitting device.

Meanwhile, the method of mounting the semiconductor light-emitting device 150 on the substrate 200 may comprise, for example, a self-assembly method (FIG. 6) and a transfer method.

Figure 6:
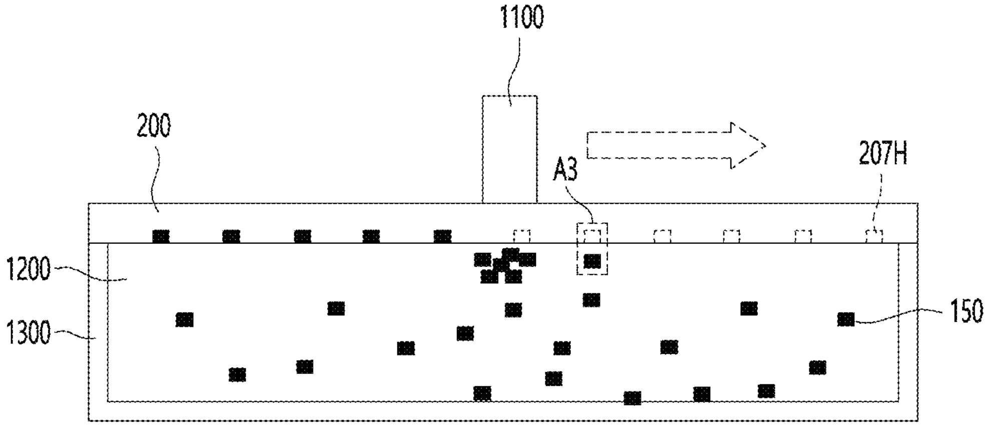
FIG. 6 is a drawing showing an example of assembling a light-emitting device according to an embodiment on a substrate by a self-assembly method.
Figure 7:
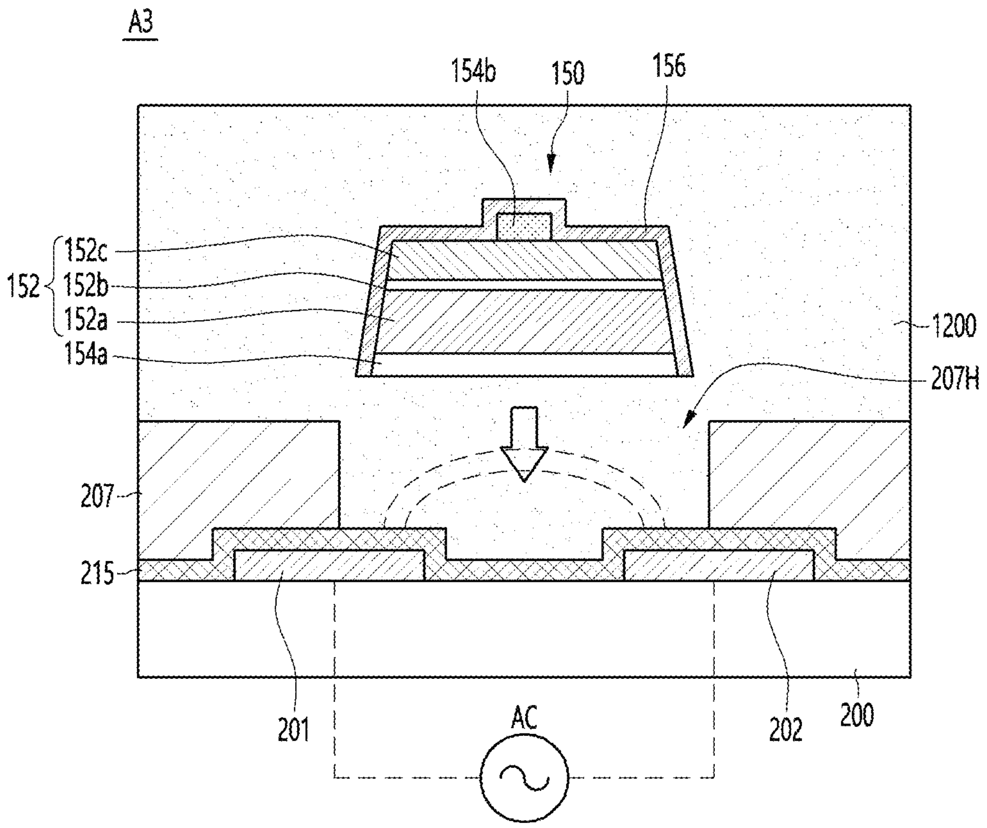
FIG. 7 is a partial enlarged view of the A3 area in FIG. 6.

FIG. 6 is a drawing showing an example of assembling a light-emitting device according to an embodiment onto a substrate by a self-assembly method, and FIG. 7 is a partial enlarged view of the A3 region of FIG. 6. FIG. 7 is a drawing in which the A3 region is rotated by 180 degrees for convenience of explanation.

Based on FIG. 6 and FIG. 7, an example of assembling a semiconductor light-emitting device according to an embodiment onto a display panel by a self-assembly method using an electromagnetic field will be described.

The assembling substrate 200 described below can also function as a panel substrate 200*a* in a display device after assembling the light-emitting device, but the embodiment is not limited thereto.

Referring to FIG. 6, the semiconductor light-emitting devices 150 can be put into a chamber 1300 filled with a fluid 1200, and the semiconductor light-emitting devices 150 can be moved to the assembling substrate 200 by a magnetic field generated from the assembly device 1100. At this time, the light-emitting device 150 adjacent to the assembly hole 207H of the assembling substrate 200 can be assembled into the assembly hole 207H by the DEP force caused by the electric field of the assembling wirings. The fluid 1200 can be water such as ultrapure water, but is not limited thereto. The chamber can be referred to a tank, a container, a vessel, etc.

After the semiconductor light-emitting devices 150 is put into the chamber 1300, the assembling substrate 200 can be disposed on the chamber 1300. According to an embodiment, the assembling substrate 200 may be put into the chamber 1300.

Referring to FIG. 7, the semiconductor light-emitting device 150 may be implemented as a vertical-type semiconductor light-emitting device as illustrated, but is not limited thereto, and a lateral-type light-emitting device may be employed.

The semiconductor light-emitting device 150 may comprise a magnetic layer (not illustrated) having a magnetic substance. The magnetic layer may comprise a metal having magnetism, such as nickel (Ni). Since the semiconductor light-emitting device 150 put into the fluid comprises the magnetic layer, it may move to the assembling substrate 200 by a magnetic field generated from the assembly device 1100. The magnetic layer may be disposed on the upper side or lower side or both sides of the light-emitting device.

The semiconductor light-emitting device 150 may comprise a passivation layer 156 surrounding the upper surface and the side surface thereof. The passivation layer 156 may be formed by using an inorganic insulator such as silica or alumina through PECVD, LPCVD, sputtering deposition, etc. In addition, the passivation layer 156 may be formed by using a method of spin coating an organic material such as a photoresist or a polymer material.

The semiconductor light-emitting device 150 may comprise a first conductivity type semiconductor layer 152*a*, a second conductivity type semiconductor layer 152*c*, and an active layer 152*b* disposed therebetween. The first conductivity type semiconductor layer 152*a* may be an n-type semiconductor layer, and the second conductivity type semiconductor layer 152*c* may be a p-type semiconductor layer, but is not limited thereto. The first conductivity type semiconductor layer 152*a*, the second conductivity type semiconductor layer 152*c*, and the active layer 152*b* disposed therebetween may form a light-emitting structure 152. The light-emitting structure 152 may be referred to a light-emitting layer, a light-emitting region, etc.

The first electrode (layer) 154*a* may be disposed under the first conductivity type semiconductor layer 152*a*, and the second electrode (layer) 154*b* may be disposed on the second conductivity type semiconductor layer 152*c*. To this end, a part of the first conductivity type semiconductor layer 152*a* or the second conductivity type semiconductor layer 152*c* may be exposed to the outside. Accordingly, after the semiconductor light-emitting device 150 is assembled on the assembling substrate 200, a part of the passivation layer 156 may be etched in the manufacturing process of the display device.

The first electrode 154*a* may comprise at least one or more layer. For example, the first electrode 154*a* may comprise an ohmic layer, a reflective layer, a magnetic layer, a conductive layer, an anti-oxidation layer, an adhesive layer, etc. The ohmic layer may comprise Au, AuBe, etc. The reflective layer may comprise Al, Ag, etc. The magnetic layer may comprise Ni, Co, etc. The conductive layer may comprise Cu, etc. The anti-oxidation layer may comprise Mo, etc. The adhesive layer may comprise Cr, Ti, etc.

The second electrode 154*b* may comprise a transparent conductive layer. For example, the second electrode 154*b* may comprise ITO, IZO, etc.

The assembling substrate 200 may comprise a pair of first assembling wirings 201 and second assembling wirings 202 corresponding to each of the semiconductor light-emitting devices 150 to be assembled. Each of the first assembling wirings 201 and the second assembling wirings 202 may be formed by laminating a single metal or a metal alloy, a metal oxide, etc. in multiple layers. For example, each of the first assembling wirings 201 and the second assembling wirings 202 may be formed by comprising at least one of Cu, Ag, Ni, Cr, Ti, Al, Rh, Pd, Ir, Ru, Mg, Zn, Pt, Au, Hf, but is not limited thereto.

In addition, each of the first assembling wiring 201 and the second assembling wiring 202 may be formed by comprising at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO Nitride (IZON), Al—Ga ZnO (AGZO), In—Ga ZnO (IGZO), ZnO, IrOx, RuOx, NiO, RuOx/ITO, Ni/IrOx/Au, and Ni/IrOx/Au/ITO, but is not limited thereto.

The first assembling wiring 201 and the second assembling wiring 202 form an electric field when an AC voltage is applied, and the semiconductor light-emitting device 150 put into the assembly hole 207H can be fixed by the DEP force caused by the electric field. The gap between the first assembling wiring 201 and the second assembling wiring 202 can be smaller than the width of the semiconductor light-emitting device 150 and the width of the assembly hole 207H, and the assembly position of the semiconductor light-emitting device 150 can be fixed more precisely using the electric field.

An insulating layer 215 is formed on the first assembling wiring 201 and the second assembling wiring 202 to protect the first assembling wiring 201 and the second assembling wiring 202 from the fluid 1200 and prevent leakage of current flowing in the first assembling wiring 201 and the second assembling wiring 202. For example, the insulating layer 215 may be formed of a single layer or multiple layers of an inorganic insulator such as silica or alumina, or an organic insulator. The insulating layer 215 may have a minimum thickness to prevent damage to the first assembling wiring 201 and the second assembling wiring 202 during assembly of the semiconductor light-emitting device 150, and may have a maximum thickness to stably assemble the semiconductor light-emitting device 150.

A partition wall 207 may be formed on the upper portion of the insulating layer 215. Some regions of the partition wall 207 may be located on the upper portion of the first assembling wiring 201 and the second assembling wiring 202, and the remaining regions may be located on the upper portion of the assembling substrate 200.

Meanwhile, when manufacturing the assembling substrate 200, some of the partition walls formed on the upper portion of the insulating layer 215 may be removed, thereby forming an assembly hole 207H in which each of the semiconductor light-emitting devices 150 is coupled and assembled to the assembling substrate 200.

An assembly hole 207H is formed in the assembling substrate 200, into which semiconductor light-emitting devices 150 are combined, and a surface on which the assembly hole 207H is formed can be in contact with a fluid 1200. The assembly hole 207H can guide an accurate assembly position of the semiconductor light-emitting device 150.

Meanwhile, the assembly hole 207H can have a shape and size corresponding to the shape of the semiconductor light-emitting device 150 to be assembled at a corresponding position. Accordingly, another semiconductor light-emitting device can be assembled in the assembly hole 207H or a plurality of semiconductor light-emitting devices can be prevented from being assembled.

Referring again to 6, after the assembling substrate 200 is disposed in the chamber, an assembly device 1100 that applies a magnetic field can move along the assembling substrate 200. The assembly device 1100 can be a permanent magnet or an electromagnet.

The assembly device 1100 may move in contact with the assembling substrate 200 to maximize the area of the magnetic field within the fluid 1200. Depending on the embodiment, the assembly device 1100 may comprise a plurality of magnetic bodies or may comprise magnetic bodies of a size corresponding to the assembling substrate 200. In this case, the movement distance of the assembly device 1100 may be limited to a predetermined range.

The semiconductor light-emitting device 150 within the chamber 1300 can move toward the assembly device 1100 and the assembling substrate 200 by the magnetic field generated by the assembly device 1100.

Referring to FIG. 7, the semiconductor light-emitting device 150 can be fixed by entering the assembly hole 207H by the DEP force formed by the electric field between the assembling wirings 201 and 202 while moving toward the assembly device 1100.

Specifically, the first and second assembling wirings 201 and 202 form an electric field by the AC power source, and the DEP force can be formed between the assembling wirings 201 and 202 by the electric field. The semiconductor light-emitting device 150 can be fixed to the assembly hole 207H on the assembling substrate 200 by the DEP force.

At this time, a predetermined solder layer (not shown) may be formed between the light-emitting device 150 assembled on the assembly hole 207H of the assembling substrate 200 and the assembling wirings 201 and 202 to improve the bonding strength of the light-emitting device 150.

In addition, a molding layer (not shown) may be formed on the assembly hole 207H of the assembling substrate 200 after assembly. The molding layer may be a transparent resin or a resin containing a reflective material or a scattering material.

By the self-assembly method using the electromagnetic field described above, the time required for each semiconductor light-emitting device to be assembled on the substrate can be drastically shortened, so that a large-area, high-pixel display can be implemented more quickly and economically.

Meanwhile, although not shown, a Vdd line may be disposed between the first assembling wiring 201 and the second assembling wiring 202, and may be used as an electrode wiring for electrically contacting the semiconductor light-emitting device 150.

However, as the semiconductor light-emitting device 150 is miniaturized, the gap between the first assembling wiring 201 and the second assembling wiring 202 also becomes narrower, and when the gap between the first assembling wiring 201 and the second assembling wiring 202 becomes narrower, a problem may occur in which the first assembling wiring 201 or the second assembling wiring 202 is electrically shorted with the Vdd line.

Figure 8A:
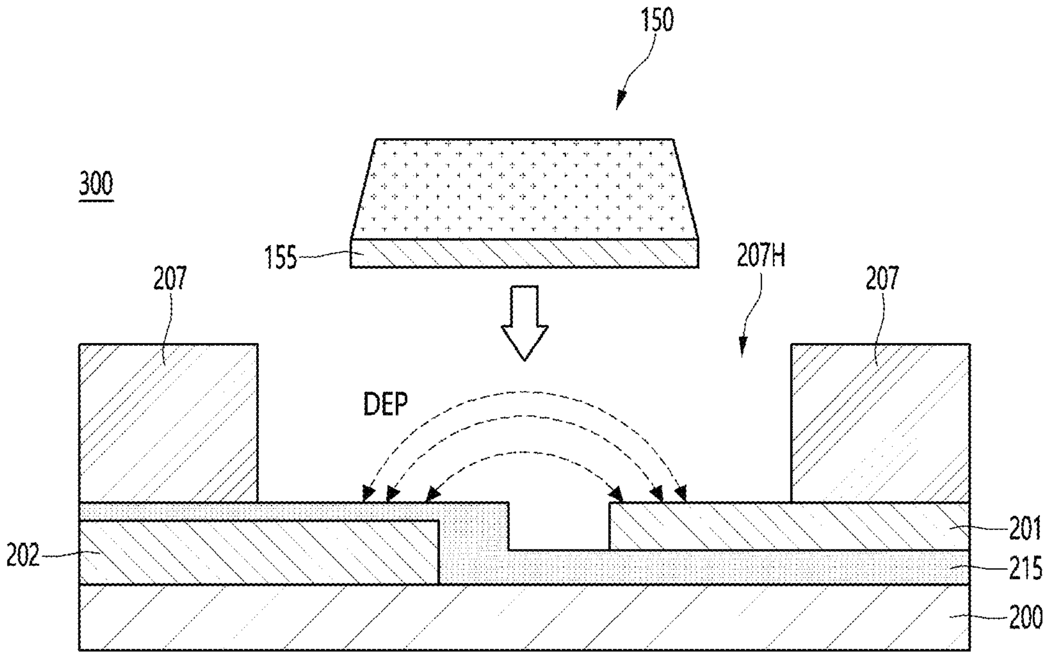
FIGS. 8A to 8B are self-assembly examples in a display device according to an internal technology.
Figure 8B:
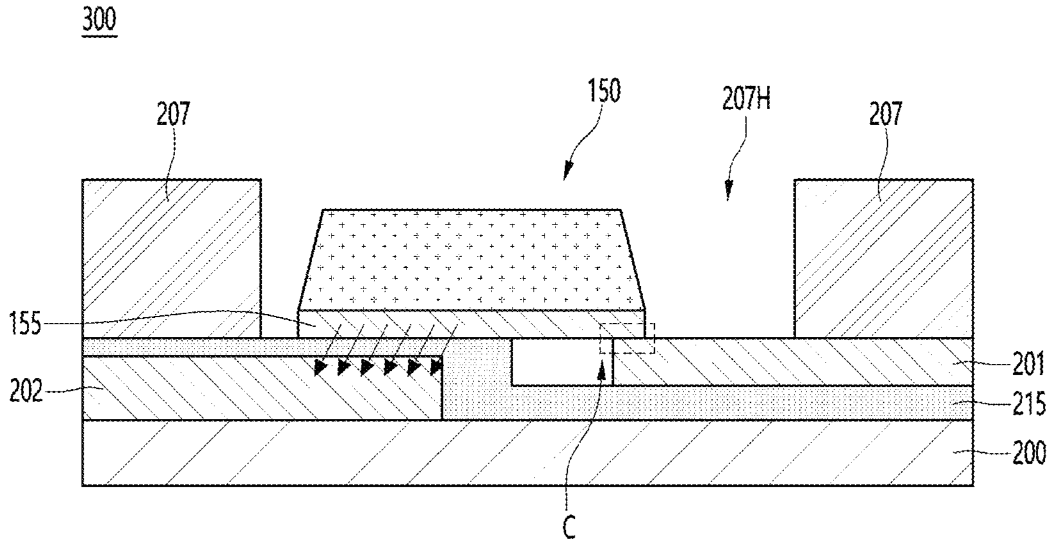
Figure 8C:
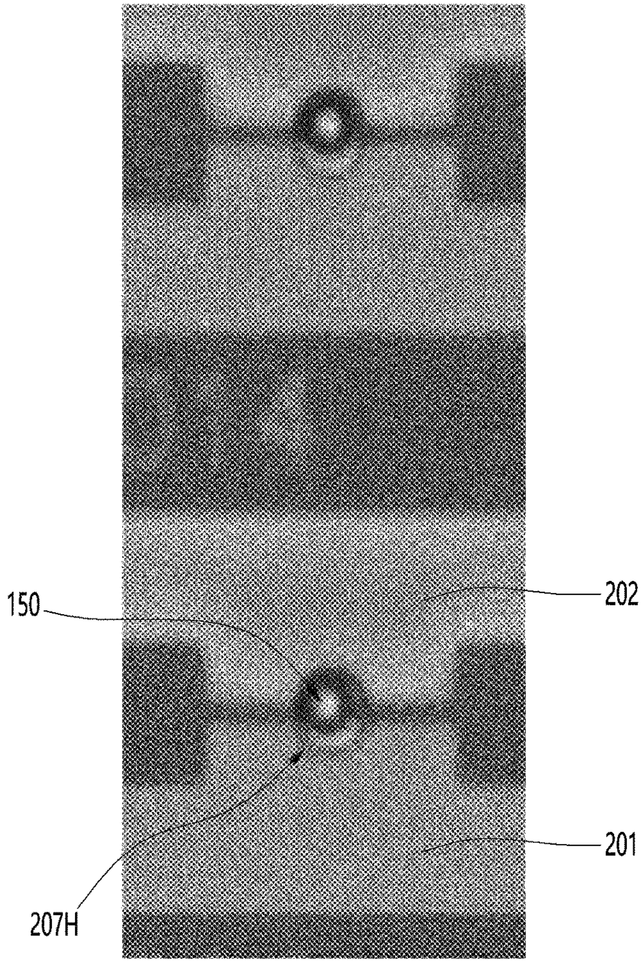
FIG. 8C is a self-assembly photograph in a display device according to an internal technology.

Next, FIGS. 8A and 8B are self-assembly examples in a display device 300 according to an internal technology, and FIG. 8C is a self-assembly photo in a display device according to an internal technology.

In the display device 300 according to an internal technology, either the first assembling wiring 201 or the second assembling wiring 202 is brought into contact with the bonding metal 155 of the semiconductor light-emitting device 150 through a bonding process.

However, in order to solve the problem that the bonding area is reduced as the semiconductor light-emitting device 150 is miniaturized, a method is used in which the existing Vdd line is omitted and its role is opened to one side of the assembling wiring, for example, the first assembling wiring 201, as shown in FIGS. 8A and 8B. Since the Vdd line is omitted, the gap between the first assembling wiring 201 and the second assembling wiring 202 can be further narrowed, making it easy to respond to miniaturization of the semiconductor light-emitting device 150.

However, when this method is used, the semiconductor light-emitting device 150, which is drawn to the first assembling wiring 201 by the DEP in the fluid, comes into contact with the first assembling wiring 201 and becomes conductive. Accordingly, the electric field force is concentrated on the second assembling wiring 202, which is not opened by the insulating layer 215, resulting in a problem in which the assembly is biased in one direction.

Referring to FIGS. 8B and 8C, the contact area C between the bonding metal 155 of the semiconductor light-emitting device 150 and the first assembling wiring 201 that functions as a panel electrode is very small, which may cause poor contact.

That is, according to the non-public internal technology, DEP force is required for self-assembly, but due to the difficulty in uniformly controlling the DEP force, there is a problem in that the semiconductor light-emitting device is tilted to a location other than the normal position within the assembly hole 207H when assembling using self-assembly.

In addition, due to this tilting phenomenon of the semiconductor light-emitting device, the electrical contact characteristics deteriorate in the subsequent electrical contact process, resulting in poor lighting rate and reduced yield.

Therefore, according to the non-public internal technology, DEP force is required for self-assembly, but when using the DEP force, there is a technical contradiction in that the electrical contact characteristics deteriorate due to the tilting phenomenon of the semiconductor light-emitting device.

Figure 8D:
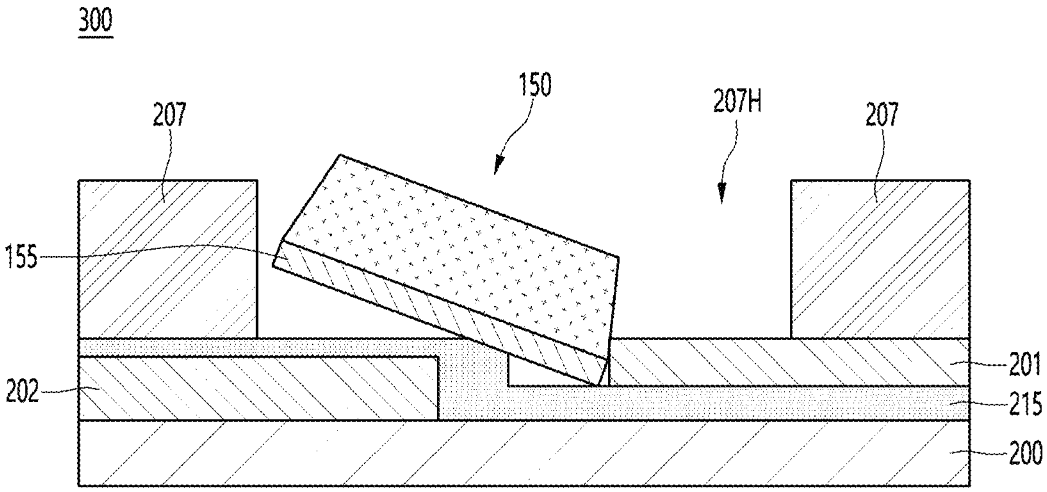
FIG. 8D is a drawing showing a tilt phenomenon that occurs during self-assembly in a display device according to an internal technology.

Next, FIG. 8D is a drawing showing a tilt phenomenon that may occur during self-assembly according to internal technology.

According to internal technology, an insulating layer 215 is disposed on the first and second assembling wirings 201 and 202 on the assembling substrate 200, and self-assembly is performed by the DEP force of the semiconductor light-emitting device 150 in the assembly hole 207H set by the partition wall 207. However, according to internal technology, there is a problem in that the electric field force is concentrated on the second assembling wiring 202, resulting in assembly being biased in one direction, and as a result, self-assembly is not performed properly and a problem in which tilt occurs within the assembly hole 207H was studied.

Figure 8E:
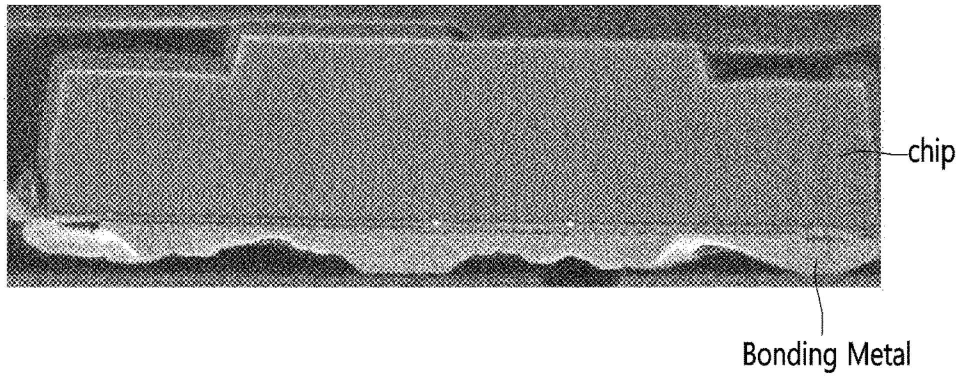
FIG. 8E is a focused ion beam (FIB) photograph of a light-emitting device (chip) and a bonding metal in a display panel according to an internal technology.

In addition, FIG. 8E is a focused ion beam (FIB) photograph of a light-emitting device (chip) and a bonding metal in a display panel according to internal technology, and FIG. 8F is lighting data in the display panel according to internal technology.

As shown in FIG. 8E, in the semiconductor light-emitting device according to the internal technology, the rear bonding metal has poor surface morphology, and the contact characteristics between the rear bonding metal of the light-emitting device and the panel wiring are poor, resulting in poor lighting.

In addition, according to the internal technology, the rear bonding metal comes into direct contact with the assembling wirings 201 and 202, and poor electrical contact occurs due to the surface unevenness of the bonding metal.

In the internal technology, the electrode layer of the light-emitting device can be made of materials such as Ti, Cu, Pt, Ag, and Au, but when a bonding metal made of materials such as Sn or In is formed on the electrode layer of such materials, the surface becomes uneven due to agglomeration, etc.

Meanwhile, in order to improve the surface characteristics of the bonding metal in the internal technology, the deposition speed was increased, but even if the agglomeration phenomenon was partially alleviated, another problem was discovered in which the grain size decreased as the deposition speed increased, thereby reducing the contact force, and it was not easy to improve the surface characteristics of the bonding metal.

Hereinafter, various embodiments for solving the above-described problem will be described with reference to FIGS. 9 to 19. Any description omitted below can be easily understood from the descriptions described above in relation to FIGS. 1 to 8 and the corresponding drawings.

First Embodiment

Figure 9:
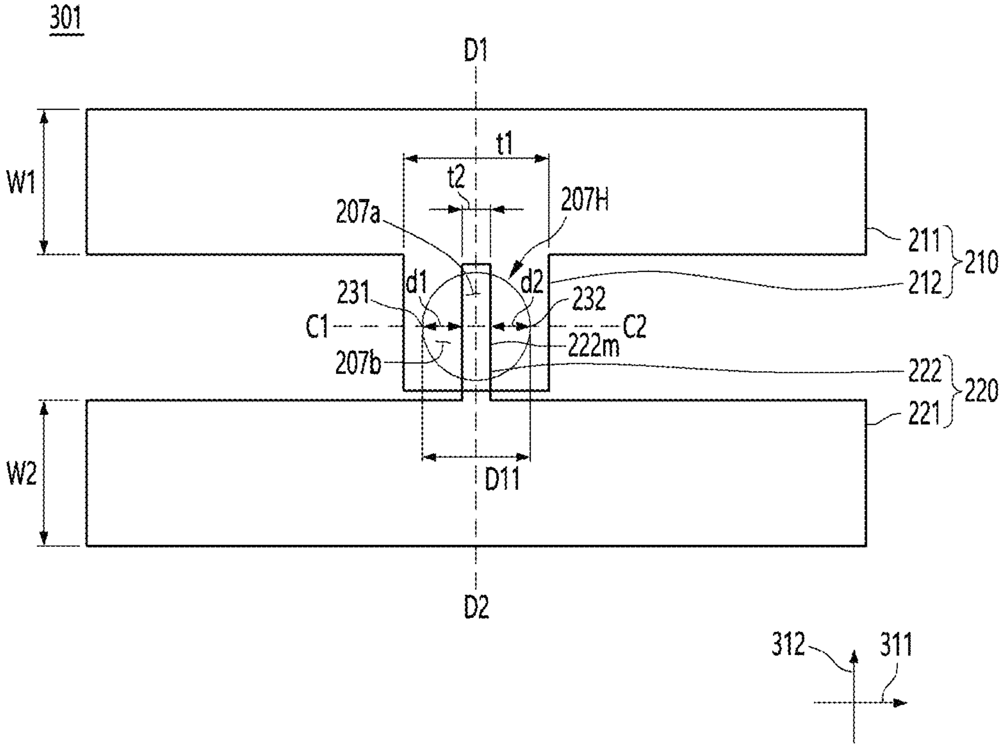
FIG. 9 is a plan view showing a display device according to a first embodiment.
Figure 10:
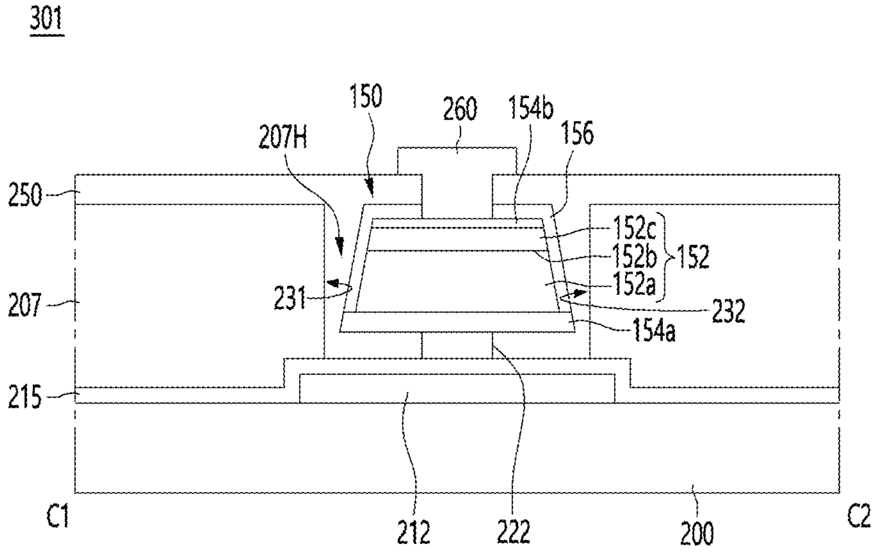
FIG. 10 is a cross-sectional view taken along the C1-C2 line of FIG. 9.
Figure 11:
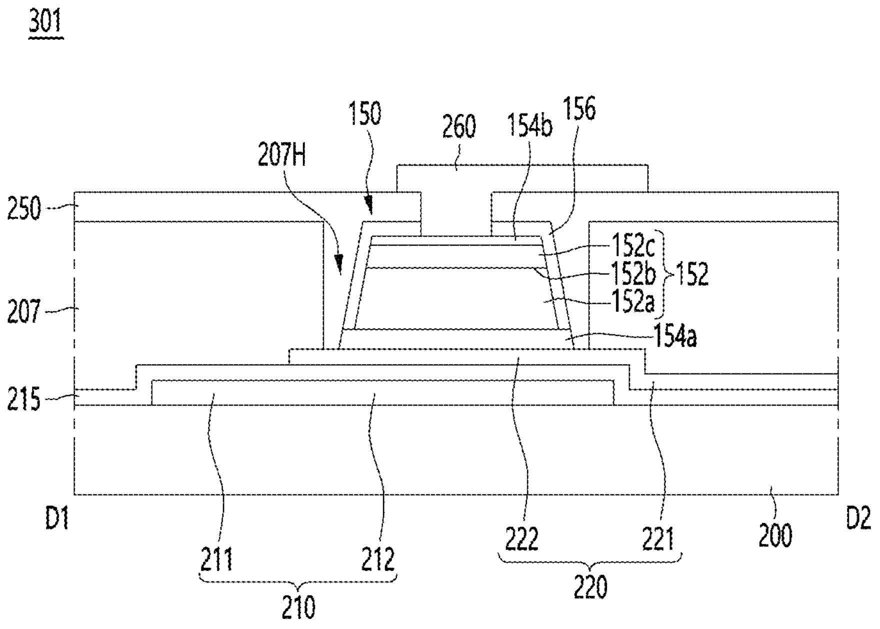
FIG. 11 is a cross-sectional view taken along the D1-D2 line of FIG. 9.

FIG. 9 is a plan view illustrating a display device according to the first embodiment. FIG. 10 is a cross-sectional view taken along the C1-C2 line of FIG. 9. FIG. 11 is a cross-sectional view taken along the D1-D2 line of FIG. 9.

Referring to FIGS. 9 to 11, the display device 301 according to the first embodiment may comprise a substrate 200, a first assembling wiring 210, a second assembling wiring 220, an insulating layer 215, a partition wall 207, and a semiconductor light-emitting device 150.

The substrate 200 may be used as an assembling substrate for assembling the semiconductor light-emitting device 150 during a self-assembly process, and may be used as a display substrate for supporting various components and displaying images after the product is shipped.

A plurality of pixels may be included on the substrate 200. FIGS. 9 to 11 illustrate one pixel among the plurality of pixels, and each of the plurality of pixels may have the same structure illustrated in FIGS. 9 to 11. However, the semiconductor light-emitting devices 150 disposed in the plurality of sub-pixels included in each of the plurality of pixels may emit light of different colors. For example, the semiconductor light-emitting device 150 may comprise a first semiconductor light-emitting device disposed in a first sub-pixel to emit a first color light, a second semiconductor light-emitting device disposed in a second sub-pixel to emit a second color light, and a third semiconductor light-emitting device disposed in a third sub-pixel to emit a third color light. For example, the first color light may be red light, the second color light may be green light, and the third color light may be blue light, but is not limited thereto.

A part of the first assembling wiring 210 may vertically overlap a part of the second assembling wiring 220. In this way, an assembly hole 207H may be formed on the first assembling wiring 210 or the second assembling wiring 220 that are vertically overlapped. The assembly hole 207H may be formed in the partition wall 207. The semiconductor light-emitting device 150 may be disposed in the assembly hole 207H.

According to the embodiment, the semiconductor light-emitting device 150 can be assembled in the normal position in the assembly hole 207H by the first assembling wiring 210 and the second assembling wiring 220 that are vertically overlapped. Accordingly, as illustrated in FIG. 8B, the problem of the semiconductor light-emitting device 150 being assembled with one side biased and the problem of poor lighting rate and reduced yield due to poor contact problem caused by a decrease in the contact area C between the semiconductor light-emitting device 150 and the first assembling wiring 201 due to the semiconductor light-emitting device 150 being assembled with one side biased can be solved. In addition, as illustrated in FIG. 8D, the problem of poor lighting rate and reduced yield caused by the semiconductor light-emitting device 150 being tilted within the assembly hole 207H can be solved.

Meanwhile, as illustrated in FIG. 9, a part of the first assembling wiring 210 may be disposed at the center of the assembly hole 207H, and a part of the second assembling wiring 220 may be disposed at the center of the assembly hole 207H.

The first assembling wiring 210 may comprise a first bus wiring 211 and a first branch electrode 212. The first bus wiring 211 may be disposed along the first direction 311. The first branch electrode 212 may extend from the first bus wiring 211 along the second direction 312.

The second assembling wiring 220 may comprise a second bus wiring 221 and a second branch electrode 222. The second bus wiring 221 may be disposed along the first direction 311. The second bus wiring 221 may be spaced apart from the first bus wiring 211 and disposed parallel or in parallel with each other. The second branch electrode 222 may extend from the second bus wiring 221 along the second direction 312. The second branch electrode 222 may extend from the second bus wiring 221 toward the first bus wiring 211.

For example, the width W1 of the first bus wiring 211 and the width W2 of the second bus wiring 221 may be the same, but are not limited thereto.

Each of the first branch electrode 212 and the second branch electrode 222 may be referred to a bar electrode, a rod electrode, a string electrode, etc.

For example, the first branch electrode 212 may extend from the first bus wiring 211 into the assembly hole 207H, and the second branch electrode 222 may extend from the second bus wiring 221 into the assembly hole 207H. In this case, the first branch electrode 212 and the second branch electrode 222 may be vertically overlapped in the assembly hole 207H.

Although the drawing illustrates that the first branch electrode 212 does not overlap the second bus wiring 221 and that the second branch electrode 222 does not overlap the first bus wiring 211, but is not limited thereto. That is, the first branch electrode 212 may extend from the first bus wiring 211 and overlap a part of the second bus wiring 221. The second branch electrode 222 may extend from the second bus wiring 221 and overlap a part of the first bus wiring 211.

For example, the width t1 of the first branch electrode 212 may be greater than the diameter D11 of the assembly hole 207H, and the width t2 of the second branch electrode 222 may be smaller than the diameter D11 of the assembly hole 207H.

The assembly hole 207H may comprise a first hole region 207*a* and a second hole region 207*b*. The first hole region 207*a* may be an area where the second assembling wiring 220 vertically overlaps the first assembling wiring 210. For example, the first hole region 207*a* may be an area where the second branch electrode 222 vertically overlaps the first branch electrode 212. The second hole region 207*b* may be an area where the second assembling wiring 220 does not vertically overlap the first assembling wiring 210. For example, the second hole region 207*b* may be a region where the second branch electrode 222 does not vertically overlap with the first branch electrode 212.

Accordingly, the second branch electrode 222 may vertically overlap with the first branch electrode 212 in the first hole region 207*a*, and may not vertically overlap with the first branch electrode 212 in the second hole region 207*b*.

As illustrated in FIG. 9, the second branch electrode 222 may comprise a bar electrode 222*m* disposed across the center of the assembly hole 207H along the second direction 312. In this case, the first hole region 207*a* may be a hole region that vertically corresponds to the bar electrode 222*m* among the assembly holes 207H, and the second hole region 207*b* may be a hole region that does not vertically correspond to the bar electrode 222*m* among the assembly holes 207H. That is, the first hole region 207*a* may be positioned on the bar electrode 222*m*, and the second hole region 207*b* may be positioned on both sides of the bar electrode 222*m*.

For example, the distance d1 between the bar electrode 222*m* and the first inner side 231 of the assembly hole 207H and the distance d2 between the bar electrode 222*m* and the second inner side 232 of the assembly hole 207H may be the same. The first inner side 231 and the second inner side 232 may face each other. For example, the first inner side 231 and the second inner side 232 may be positioned on the first direction 311.

The areas of the second hole regions 207*b* positioned on both sides of the bar electrode 222*m* may be the same. For example, the area of the second hole region 207*b* positioned on the left side of the bar electrode 222*m* may be the same as the area of the second hole region 207*b* positioned on the right side of the bar electrode 222*m*. In this way, the areas of the second hole regions 207*b* positioned on both sides of the bar electrode 222*m* are the same, which may mean that the areas of the first branch electrodes 212 corresponding vertically to the second hole regions 207*b* positioned on both sides of the bar electrode 222*m* are the same. When self-assembly is performed, an AC voltage may be applied to the first branch electrode 212 and the second branch electrode 222, so that a DEP force can be formed by an electric field. In this case, since the area of the first branch electrode 212 corresponding vertically to the second hole region 207*b* located on both sides of the bar electrode 222*m* is the same, the DEP force formed in each of the second hole regions 207*b* located on both sides of the bar electrode 222*m* can be uniform and the same. Accordingly, the semiconductor light-emitting device 150 can be assembled and fixed in the normal position within the assembly hole 207H.

Figure 12A:
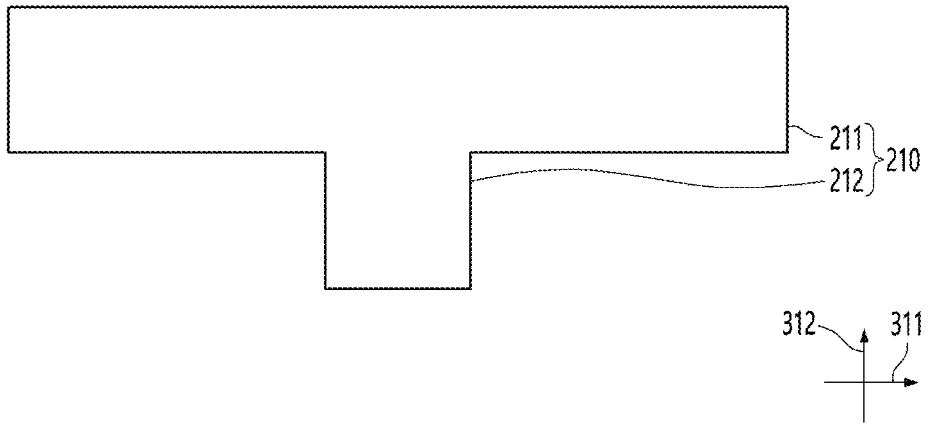
FIGS. 12A to 12C illustrate the process of forming the first assembling wiring, the second assembling wiring, and the assembly hole.
Figure 12B:
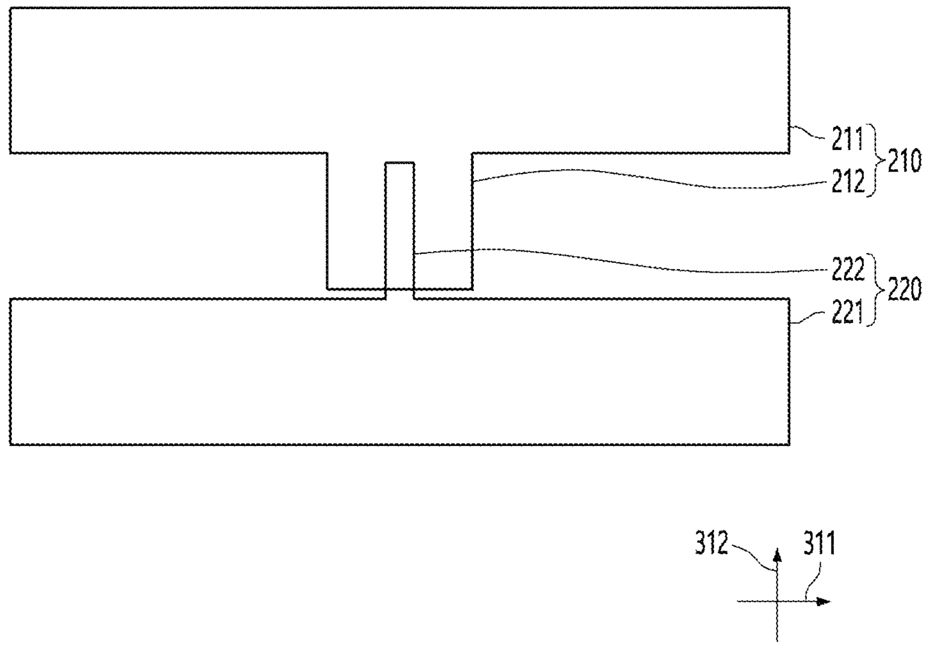
Figure 12C:
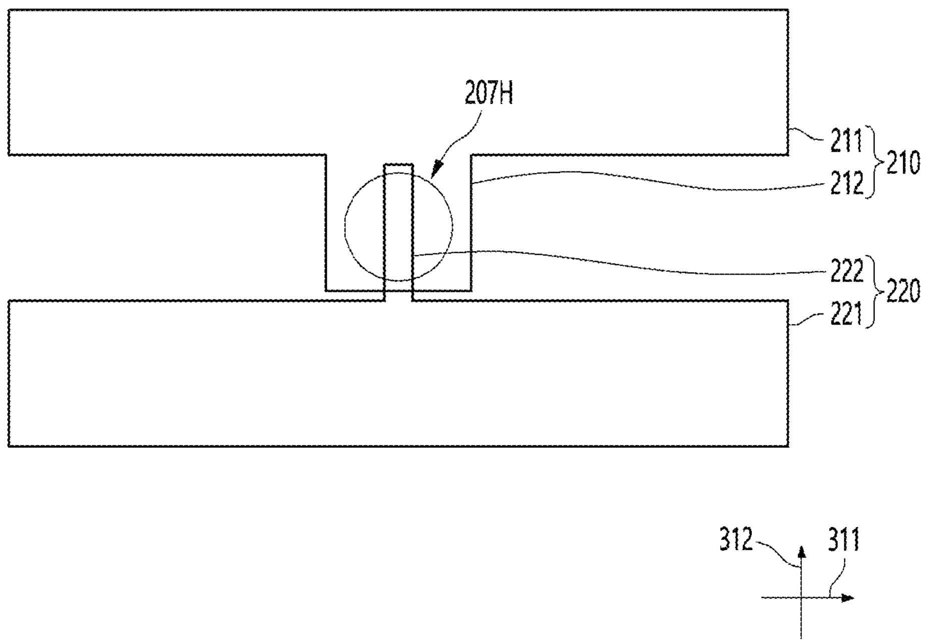

Next, FIGS. 12A to 12C illustrate the formation process of the first assembling wiring 210, the second assembling wiring 220, and the assembly hole 207H.

As illustrated in FIG. 12A, a first assembling wiring 210 comprising a first bus wiring 211 and a first branch electrode 212 may be formed on a substrate 200. At this time, the first bus wiring 211 may be formed along a first direction 311, and the first branch electrode 212 may be formed extending from the first bus wiring 211 along a second direction 312.

As illustrated in FIG. 12B, a second assembling wiring 220 comprising a second bus wiring 221 and a second branch electrode 222 may be formed. At this time, the second bus wiring 221 may be formed along a first direction 311, and the second branch electrode 222 may be formed extending from the second bus wiring 221 along a second direction 312. That is, the second branch electrode 222 can extend from the second bus wiring 221 toward the first bus wiring 211. Accordingly, the second branch electrode 222 can vertically overlap the first branch electrode 212.

An insulating layer (215 of FIGS. 10 and 11) is formed between the first assembling wiring 210 and the second assembling wiring 220, so that the first assembling wiring 210 and the second assembling wiring 220 are insulated, thereby preventing an electrical short circuit.

As illustrated in FIG. 12C, a partition wall 207 having an assembly hole 207H can be formed. At this time, the assembly hole 207H may comprise the first branch electrode 212 and the second branch electrode 222. That is, the assembly hole 207H may comprise a region where the first branch electrode 212 and the second branch electrode 222 overlap, that is, a first hole region 207*a*, and a region where the first branch electrode 212 and the second branch electrode 222 do not overlap, that is, a second hole region 207*b*.

The first hole region 207*a* may be a region corresponding vertically to the second branch electrode 222 among the assembly holes 207H, and the second hole region 207*b* may be the remaining region among the assembly holes 207H, excluding the second branch electrode 222. Since the second branch electrode 222 is an electrode 222*m* disposed across the center of the assembly hole 207H, the second hole region 207*b* may be defined on each of the two sides of the second branch electrode 222 within the assembly hole 207H.

In the drawing, the assembly hole 207H has a circular shape when viewed from above, but is not limited thereto. The shape of the assembly hole 207H may be determined according to the shape of the semiconductor light-emitting device 150. That is, the shape of the assembly hole 207H may be formed in consideration of the shape of the semiconductor light-emitting device 150. For example, the assembly hole 207H may have a shape corresponding to the shape of the semiconductor light-emitting device 150. For example, when the semiconductor light-emitting device 150 has a circular shape, the assembly hole 207H may also have a circular shape. When the semiconductor light-emitting device 150 has an oval shape, the assembly hole 207H may also have an oval shape. Since the semiconductor light-emitting device 150 must be inserted into the assembly hole 207H, the size of the assembly hole 207H may be made greater than the size of the semiconductor light-emitting device 150, so that when the semiconductor light-emitting device 150 is inserted into the assembly hole 207H, the outer side of the semiconductor light-emitting device 150 may be spaced apart from the inner side of the assembly hole 207H.

Meanwhile, referring to FIG. 10 and FIG. 11, the insulating layer 215 may be disposed on the first assembling wiring 210. The insulating layer 215 may be disposed on the entire area of the substrate 200. Accordingly, the insulating layer 215 may contact not only the upper surface of the first assembling wiring 210 but also the upper surface of the substrate 200. The insulating layer 215 may comprise an organic material or an inorganic material.

The partition wall 207 may be disposed on the second assembling wiring 220. That is, after the partition wall 207 is formed on the entire area of the substrate 200, a part of the partition wall 207 may be removed to form the assembly hole 207H. The assembly hole 207H is an area where the semiconductor light-emitting device 150 is disposed, and the assembly hole 207H may be formed in each of the plurality of sub-pixels of each of the plurality of pixels. The partition wall 207 may comprise an organic material, but is not limited thereto. The partition wall 207 may have a single layer or multiple layers, and the multiple layers may comprise different materials, but is not limited thereto.

A semiconductor light-emitting device 150 may be disposed in the assembly hole 207H. The semiconductor light-emitting device 150 may be disposed in each of a plurality of sub-pixels of each of a plurality of pixels. At this time, the semiconductor light-emitting device 150 disposed in each of the plurality of sub-pixels may emit light of different colors.

The semiconductor light-emitting device 150 may contact the second branch electrode 222 in the first hole region 207*a*, and may not contact the second branch electrode 222 in the second branch region in the second hole region 207*b*.

The second branch electrode 222 can be electrically connected to the lower side of the semiconductor light-emitting device 150, and thus can be used as an electrode wiring for emitting light from the semiconductor light-emitting device 150. Another electrode wiring may be an electrode wiring 260 disposed on the partition wall 207, as shown in FIGS. 10 and 11. Accordingly, the semiconductor light-emitting device 150 can emit light by a voltage applied to the second branch electrode 222 and the electrode wiring 260.

The semiconductor light-emitting device 150 may comprise a first conductivity type semiconductor layer 152*a*, an active layer 152*b*, a second conductivity type semiconductor layer 152*c*, a first electrode 154*a*, a second electrode 154*b*, and a passivation layer 156. The first conductivity type semiconductor layer 152*a*, the active layer 152*b*, and the second conductivity type semiconductor layer 152*c* may form a light-emitting structure 152. The light-emitting structure may be referred to a light-emitting layer, a light-emitting region, or the like. These components 152*a*, 152*b*, 152*c*, 154*a*, 154*b*, and 156 of the semiconductor light-emitting device 150 may be easily understood from the description of the components of the semiconductor light-emitting device 150 illustrated in FIG. 7, and thus a detailed description thereof will be omitted.

Meanwhile, the display device 301 according to the first embodiment may comprise an insulating layer 250 and an electrode wiring 260. For convenience, the insulating layer 215 may be referred to as a first insulating layer 215, and the insulating layer 250 may be referred to as a second insulating layer.

The second insulating layer 250 may be disposed on the partition wall 207. The second insulating layer 250 may be disposed on the entire area of the substrate 200, and may be disposed not only on the partition wall 207 but also within the assembly hole 207H. The second insulating layer 250 may cover the semiconductor light-emitting device 150 disposed within the assembly hole 207H, thereby reinforcing the fixation of the semiconductor light-emitting device 150. In addition, the second insulating layer 250 can protect the semiconductor light-emitting device 150 from external foreign substances or external impact by covering the semiconductor light-emitting device 150 disposed in the assembly hole 207H. The second insulating layer 250 may comprise an organic material or an inorganic material.

The electrode wiring 260 can be disposed on the second insulating layer 250. The electrode wiring 260 can be used as an electrode for supplying voltage to the semiconductor light-emitting device 150. To this end, the electrode wiring 260 can be electrically connected to the upper side of the semiconductor light-emitting device 150 through the second insulating layer 250.

Meanwhile, the second assembling wiring 220, i.e., the second branch electrode 222, can also be used as an electrode for supplying voltage to the semiconductor light-emitting device 150.

For convenience, when the semiconductor light-emitting device 150 emits light to display an image, the second assembling wiring 220 may be used as a lower electrode wiring, and the electrode wiring 260 disposed on the partition wall 207 may be used as an upper electrode wiring.

For example, one of the lower electrode wiring 220 and the upper electrode wiring 260 may be a common electrode wiring commonly connected to a plurality of sub-pixels of each of a plurality of pixels. Here, the lower electrode wiring 220 may be the second assembling wiring 220, that is, the second bus wiring 221 and the second branch wiring, and the upper electrode wiring 260 may be the electrode wiring 260. The lower electrode wiring 220 may be referred to a second electrode wiring, and the upper electrode wiring 260 may be referred to a lower electrode wiring. For example, the upper electrode wiring 260 may be used as a common electrode wiring. In this case, light having different luminance can be emitted from each of the plurality of sub-pixels of each of the plurality of pixels by different voltages applied to the lower electrode wiring 220, i.e., the second branch electrode 222, which is disposed in each of the plurality of sub-pixels of each of the plurality of pixels, and thus, an image having different grayscale can be displayed from each of the plurality of sub-pixels of each of the plurality of pixels by the light having different luminance.

Figure 13A:
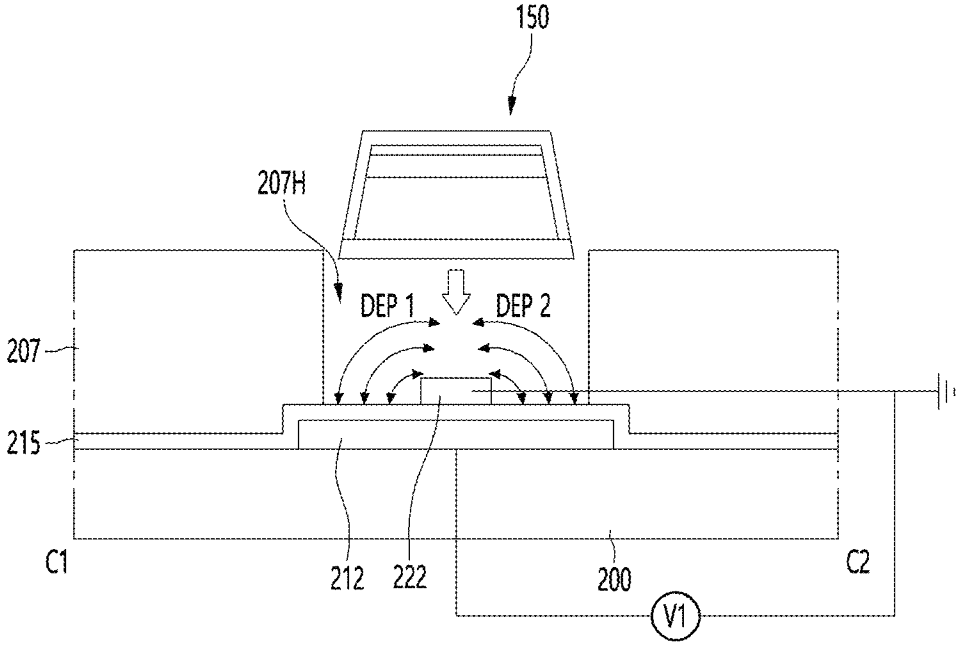
FIGS. 13*a* and 13*b* illustrate the process of assembling a semiconductor light-emitting device.
Figure 13B:
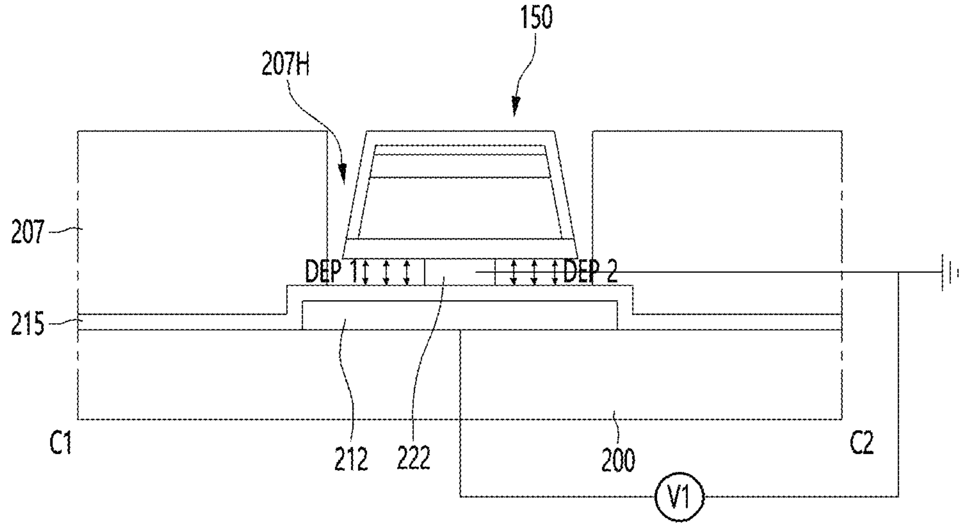

FIG. 13A and FIG. 13B illustrate an assembly process of a semiconductor light-emitting device.

As illustrated in FIG. 13A, a substrate 200 can be mounted in a chamber (1300 of FIG. 6) for a self-assembly process.

Next, an AC voltage V1 may be applied to the first branch electrode 212 of the first assembling wiring 210 and the second branch electrode 222 of the second assembling wiring 220, so that a DEP force can be formed between the first branch electrode 212 and the second branch electrode 222.

As illustrated in FIG. 9, since the second branch electrode 222 is disposed across the center of the assembly hole 207H, DEP forces DEP 1 and DEP 2 can be formed on both sides of the second branch electrode 222 based on the second branch electrode 222. That is, DEP forces DEP 1 and DEP 2 can be formed symmetrically on both sides of the second branch electrode 222 based on the second branch electrode 222. For example, a first DEP force DEP 1 may be formed between the first branch electrode 212 and the second branch electrode 222 in the first hole region 207*a*, and a second DEP force DEP 2 may be formed between the first branch electrode 212 and the second branch electrode 222 in the second hole region 207*b*.

Each of the first DEP force DEP 1 and the second DEP force DEP 2 may be formed on both sides along the lengthwise direction of the second branch electrode 222. For example, the value of the first DEP force DEP 1 and the value of the second DEP force DEP 2 may be the same. For example, the volume of the first DEP force DEP 1 and the volume of the second DEP force DEP 2 may be the same.

Next, as the assembly device 1100 moves along the substrate 200, the semiconductor light-emitting devices 150 in the fluid 1200 may be moved by the assembly device 1100, and when the semiconductor light-emitting devices 150 pass through the assembly hole 207H of the substrate 200, they can be inserted into the assembly hole 207H by the DEP forces DEP 1 and DEP 2 within the assembly hole 207H.

As illustrated in FIG. 13*b*, the semiconductor light-emitting devices 150 inserted into the assembly hole 207H can be positioned properly without being biased to one side within the assembly hole 207H by the first DEP force DEP 1 and the second DEP force DEP 2 that are uniformly formed on both sides based on the second branch electrode 222. That is, the center line of the semiconductor light-emitting device 150 may be placed on the second branch electrode 222 so that it is aligned with the center line passing through the center of the assembly hole 207H, the center line passing through the center of the first branch electrode 212, or the center line passing through the center of the second branch electrode 222. For example, the lower surface of the semiconductor light-emitting device 150 may be in contact with the upper surface of the second branch electrode 222. For example, the lower surface of the semiconductor light-emitting device 150 may be positioned apart from the upper surface of the second branch electrode 222 and may be fixed to the normal position, i.e., the center position, of the assembly hole 207H by the first DEP force DEP 1 and the second DEP force DEP 2.

Figure 14:
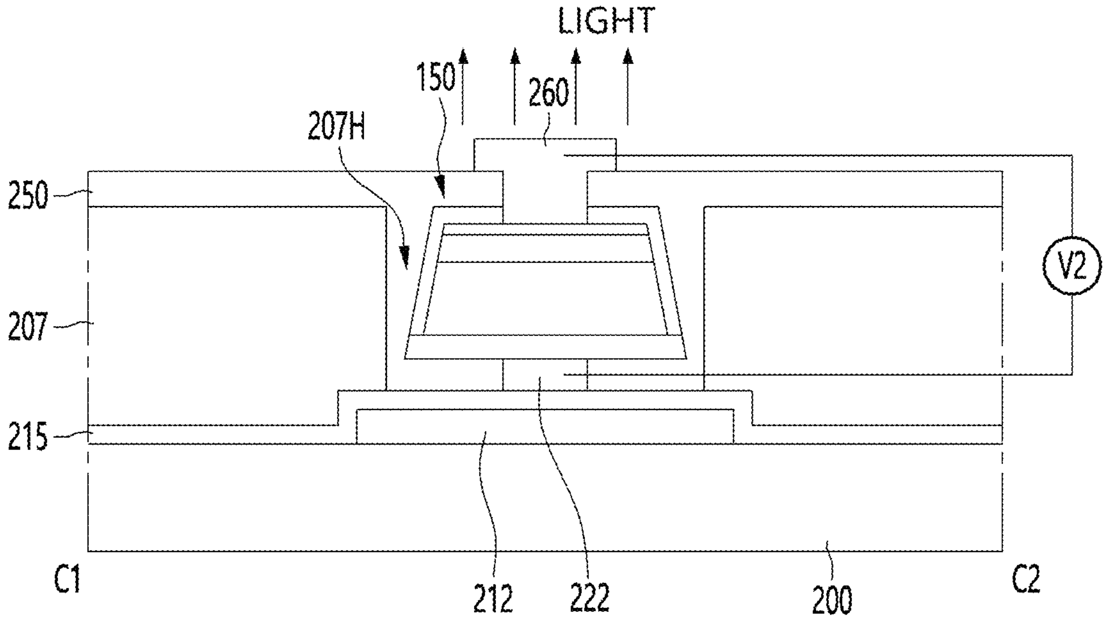
FIG. 14 illustrates the process of emitting light of a display device according to the first embodiment.

FIG. 14 illustrates a light-emitting process of a display device according to the first embodiment.

As illustrated in FIG. 14, after the semiconductor light-emitting device 150 is mounted on the substrate 200 by the self-assembly process (FIGS. 13 and 13*b*), a series of post-processes, such as the formation process of each of the second insulating layer 250 and the electrode wiring 260, and various circuit configurations comprising a driving circuit are mounted, so that the display device 301 can be manufactured.

The semiconductor light-emitting device 150 can emit light to display an image in the display device 301. To this end, the second assembling wiring 220, that is, the second bus wiring 221 and the second branch electrode 222, can be used as the first electrode wiring, and the electrode wiring 260 can be used as the second electrode wiring. For example, the second voltage V2 can be applied to the semiconductor light-emitting device 150 to emit light. By the second voltage V2, current flows through the electrode wiring 260, the semiconductor light-emitting device 150, and the second assembling wiring 220, that is, the second bus wiring 221 and the second branch electrode 222, and by this current, electrons may be generated in the first conductivity type semiconductor layer 152*a* of the semiconductor light-emitting device 150, and holes may be generated in the second conductivity type semiconductor layer 152*c*. These electrons and holes may be injected into the active layer 152*b* of the semiconductor light-emitting device 150 and recombined, thereby generating light of a specific color. The wavelength of the light of the specific color may vary depending on the semiconductor material, mixture thereof, or composition ratio of the mixture of the active layer 152*b* of the semiconductor light-emitting device 150.

For example, the electrode wiring 260 may be an anode electrode to which a positive potential (+) voltage is applied, and the second assembling wiring 220 may be a cathode electrode to which a negative potential (−) voltage is applied.

For example, the electrode wiring 260 may be a common electrode wiring commonly connected to the plurality of sub-pixels of each of the plurality of pixels. The electrode wiring 260 may be a transparent electrode having excellent transparency so as not to interfere with the propagation of light generated from the semiconductor light-emitting device 150. For example, the transparent electrode may comprise ITO, IZO, etc., but is not limited thereto.

If the electrode wiring 260 is grounded as a common electrode, by varying the voltage V2 applied to the second assembling wiring 220, the intensity of the current flowing to the semiconductor light-emitting device 150 may vary, and the luminance of the light generated from the semiconductor light-emitting device 150 may vary due to the varied current. Depending on the varied luminance of the light, images with different grayscales may be displayed in each of the plurality of sub-pixels of each of the plurality of pixels.

Meanwhile, the first embodiment may comprise more components than those described above, but is not limited thereto.

According to the first embodiment, as illustrated in FIGS. 9 to 11, the width t1 of the first branch electrode 212 may be greater than the diameter D11 of the assembly hole 207H, and the width t2 of the second branch electrode 222 may be smaller than the diameter D11 of the assembly hole 207H. Accordingly, the assembly hole 207H may comprise a first hole region 207*a* in which the second branch electrode 222 vertically overlaps the first branch electrode 212, and a second hole region 207*b* in which the second branch electrode 222 does not vertically overlap the first branch electrode 212. When an AC voltage (V1 of FIG. 13*a*) is applied to the first branch electrode 212 and the second branch electrode 222 for self-assembly, a first DEP force and a second DEP force may be formed in the second hole region 207*b* located on both sides of the second branch electrode 222 based on the second branch electrode 222. At this time, the second branch electrode 222 may comprise a bar electrode 222*m* disposed across the center of the assembly hole 207H.

Accordingly, since the distance d1 between the bar electrode 222*m* and the first inner side 231 of the assembly hole 207H and the distance d2 between the bar electrode 222*m* and the second inner side 232 of the assembly hole 207H are the same, the first DEP force formed in the first hole region 207*a* and the second DEP force formed in the second hole region 207*b* are the same. Accordingly, the semiconductor light-emitting device 150 inserted into the assembly hole 207H during self-assembly may not be biased toward one side of the assembly hole 207H, for example, the first inner side 231 or the second inner side 232, and may be positioned with its center at the center of the assembly hole 207H or the center of the second branch electrode 222. That is, the semiconductor light-emitting device 150 may be positioned correctly within the assembly hole 207H and fixed by the first DEP force and the second DEP force. Since the semiconductor light-emitting device 150 is fixed within the assembly hole 207H by the first DEP force and the second DEP force, it does not fall out of the assembly hole 207H after the self-assembly process is completed or completed, so that the self-assembly rate and assembly yield may be significantly improved.

Meanwhile, the second branch electrode 222 used as the lower electrode wiring is disposed at the center of the assembly hole 207H, and the lower surface of the semiconductor light-emitting device 150 can directly contact the upper surface of the second branch electrode 222. In this case, even if the semiconductor light-emitting device 150 is tilted to one side within the assembly hole 207H, the entire area of the second branch electrode 222 can contact the lower surface of the semiconductor light-emitting device 150. Accordingly, since poor electrical contact between the semiconductor light-emitting device 150 and the second branch electrode 222 in each of the plurality of sub-pixels of each of the plurality of pixels is prevented, the lighting rate can be significantly improved. In addition, since the contact area between the semiconductor light-emitting device 150 and the second branch electrode 222 in each of the plurality of sub-pixels of each of the plurality of pixels is the same, a uniform lighting rate can be secured between the plurality of pixels or between the plurality of sub-pixels.

Meanwhile, since the width t2 of the second branch electrode 222 is relatively small compared to the diameter of the semiconductor light-emitting device 150, when the semiconductor light-emitting device 150 is properly positioned in the assembly hole 207H, it is difficult to support it on the narrow width t2 of the second branch electrode 222, so that the semiconductor light-emitting device 150 may shake left and right on the second branch electrode 222 and eventually be tilted to one side.

To solve this problem, the second to fifth embodiments were provided. That is, by disposing various auxiliary electrodes (222*a* of FIGS. 15 and 17, 222*a*1 and 222*a*2 of FIGS. 18, 222*a*1 to 222*a*3 of FIG. 19) that intersect the bar electrode 222*m* of the second branch electrode 222, the semiconductor light-emitting device 150 can be positioned by preventing the semiconductor light-emitting device 150 from being tilted to one side due to left-right shaking. The second to fifth embodiments will be described in detail below.

Second Embodiment

Figure 15:
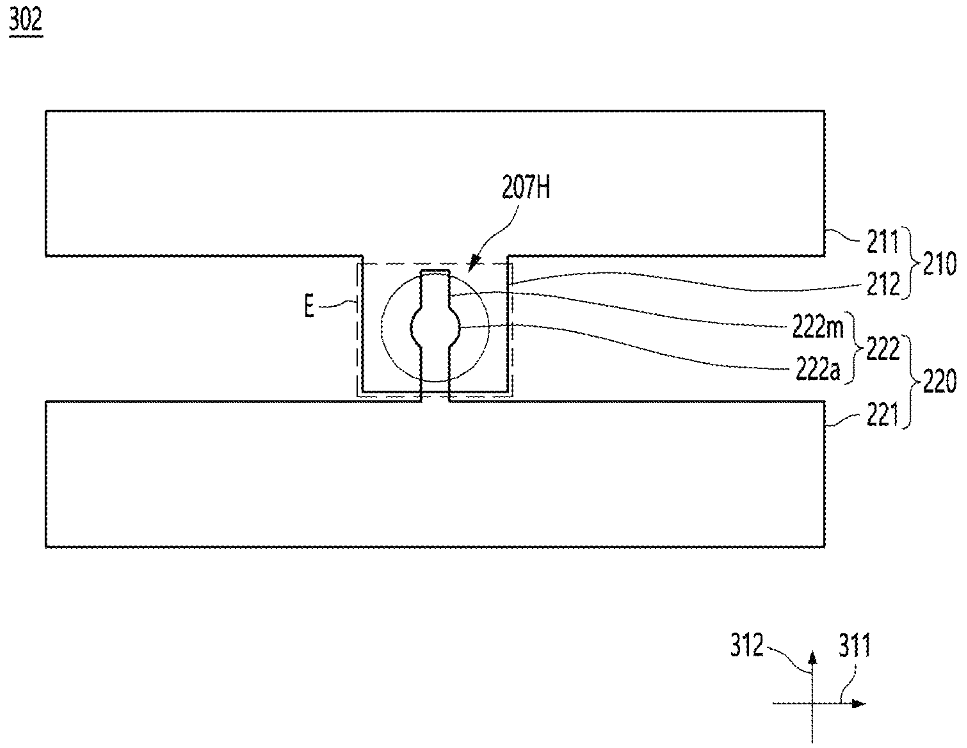
FIG. 15 is a plan view illustrating a display device according to a second embodiment.
Figure 16:
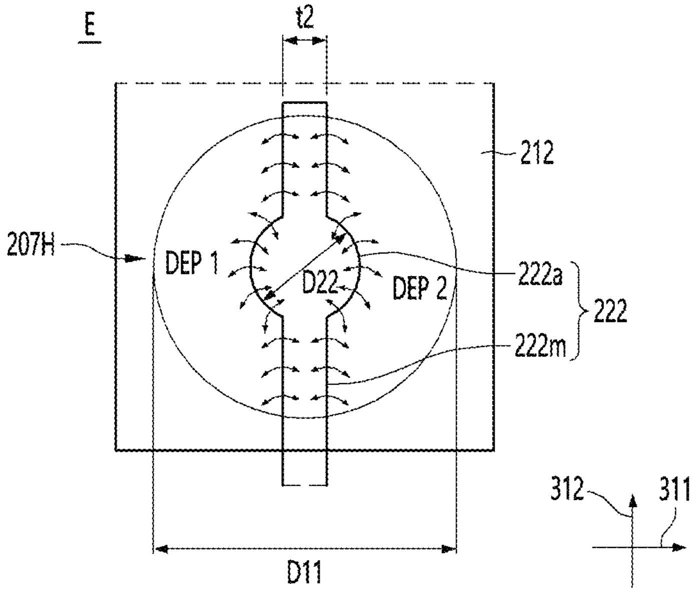
FIG. 16 is a partial enlarged view of the E area of FIG. 15.

FIG. 15 is a plan view illustrating a display device according to a second embodiment. FIG. 16 is a partial enlarged view of the E area of FIG. 15.

The second embodiment is the same as the first embodiment except for the auxiliary electrode 222*a*. In the second embodiment, components having the same structure, shape, and/or function as those in the first embodiment are given the same drawing reference numerals and detailed descriptions are omitted.

The second embodiment can be described with reference to FIGS. 15 and 16 as well as FIGS. 10 and 11.

Referring to FIGS. 10, 11, 15, and 16, the display device 302 according to the second embodiment may comprise a substrate 200, a first assembling wiring 210, a second assembling wiring 220, a first insulating layer 215, a partition wall 207, a semiconductor light-emitting device 150, a second insulating layer 250, and an electrode wiring 260. The second embodiment may comprise more components than these, but is not limited thereto.

The first assembling wiring 210 may comprise the first bus wiring 211 and the first branch electrode 212, and the second assembling wiring 220 may comprise the second bus wiring 221 and the second branch electrode 222.

A part of the second assembling wiring 220, that is, the second branch electrode 222, may be disposed on the upper side of a part of the first assembling wiring 210, that is, the first branch electrode 212. For example, the second branch electrode 222 may vertically overlap the first branch electrode 212.

The width t1 of the first branch electrode 212 may be greater than the diameter D11 of the assembly hole 207H, and the width t2 of the second branch electrode 222 may be smaller than the diameter D11 of the assembly hole 207H. Accordingly, the assembly hole 207H may comprise a first hole region 207*a* in which the second branch electrode 222 vertically overlaps the first branch electrode 212, and a second hole region 207*b* in which the second branch electrode 222 does not vertically overlap the first branch electrode 212.

According to the structure of each of the first branch electrode 212, the second branch electrode 222, and the assembly hole 207H, or the arrangement relationship therebetween, a first DEP force and a second DEP force having uniform or identical intensities may be formed on both sides based on the second branch electrode 222, so that the semiconductor light-emitting device 150 may be inserted into the assembly hole 207H and aligned in a normal position, and may be fixed in a state of a normal position on the second branch electrode 222 by the first DEP force and the second DEP force.

The second branch electrode 222 may comprise a bar electrode 222*m* and an auxiliary electrode 222*a*.

The bar electrode 222*m* may be disposed along the second direction 312 across the center of the assembly hole 207H.

The auxiliary electrode 222*a* may be disposed at the center of the assembly hole 207H and may have a diameter D22 greater than the width t2 of the bar electrode 222*m*. For example, the auxiliary electrode 222*a* may have a circular shape. The auxiliary electrode 222*a* may have a shape corresponding to the shape of the assembly hole. For example, when the assembly hole 207H has a circular shape, the auxiliary electrode 222*a* may have a circular shape. In this case, the distance between the outer side along the perimeter of the auxiliary electrode 222*a* and the inner side along the perimeter of the assembly hole 207H may be the same.

Both sides of the auxiliary electrode 222*a* may be connected to the bar electrode 222*m*. For example, the auxiliary electrode 222*a* may be disposed at the center of the bar electrode 222*m*. For example, the bar electrode 222*m* may extend from both sides of the auxiliary electrode 222*a* toward the first bus wiring 211 and the second bus wiring 221, respectively. For example, one side of the bar electrode 222*m* may extend from the second bus wiring 221 toward the center of the assembly hole 207H and may come into contact with one side of the auxiliary electrode 222*a*. For example, the other side of the bar electrode 222*m* may extend from the other side of the auxiliary electrode 222*a* toward the first bus wiring 211.

Since the auxiliary electrode 222*a* disposed in the center of the assembly hole 207H has a circular shape and its diameter D22 is greater than the width t2 of the bar electrode 222*m*, the semiconductor light-emitting device 150 positioned in the center of the assembly hole 207H has an expanded contact area with the auxiliary electrode 222*a*, and can be positioned in the assembly hole 207H without shaking left and right. In addition, the contact area with the semiconductor light-emitting device 150 may be expanded by the circular auxiliary electrode 222*a* having a diameter D22 greater than the width t2 of the bar electrode 222*m*, so that the electrical characteristics and optical characteristics can be improved.

Meanwhile, the circular auxiliary electrode 222*a* can be disposed in the center of the assembly hole 207H, and the first DEP force and the second DEP force can be formed on both sides based on the auxiliary electrode 222*a*. In addition, the bar electrode 222*m* may be disposed along the second direction 312 on both sides of the auxiliary electrode 222*a*, so that the first DEP force and the second DEP force can be formed on both sides based on the bar electrode 222*m*. Accordingly, the first DEP force and the second DEP force may be formed on both sides of not only the bar electrode 222*m* but also the auxiliary electrode 222*a*, so that the semiconductor light-emitting device 150 can be more precisely positioned and more strongly fixed in the assembly hole 207H.

According to the second embodiment, by disposing the circular auxiliary electrode 222*a* having a diameter D22 greater than the width of the bar electrode 222*m* at the center of the assembly hole 207H, the semiconductor light-emitting device 150 can be positioned properly by preventing one-sided tilting due to left-right shaking of the semiconductor light-emitting device 150.

Third Embodiment

Figure 17:
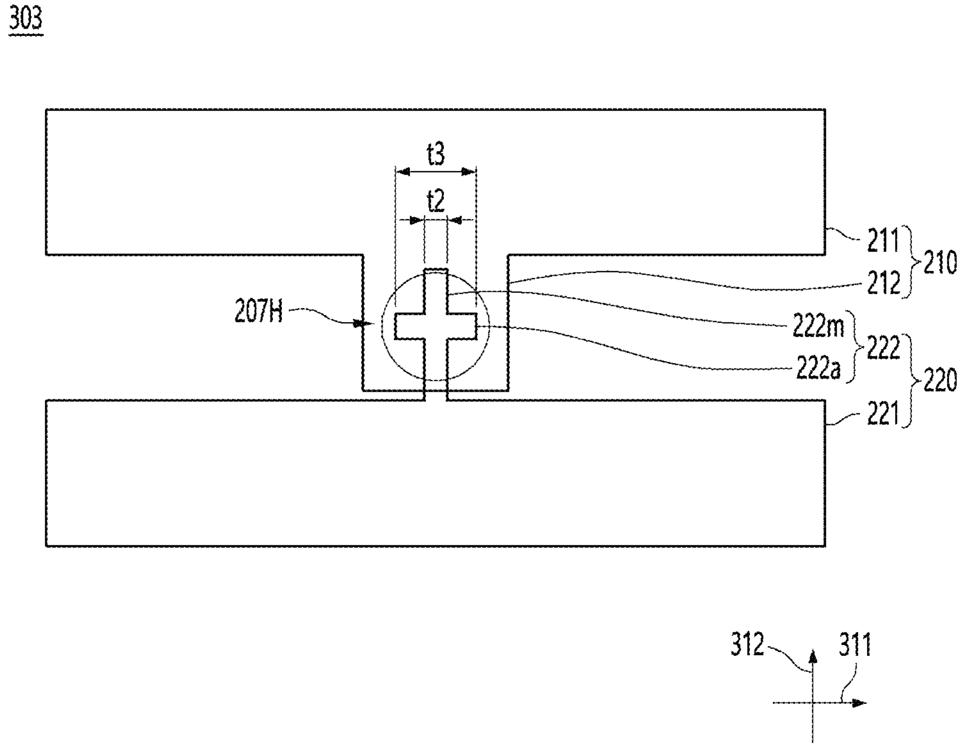
FIG. 17 is a plan view illustrating a display device according to a third embodiment.

FIG. 17 is a plan view illustrating a display device according to a third embodiment.

The third embodiment is the same as the first embodiment and similar to the second embodiment except for the auxiliary electrode 222*a*. In the third embodiment, components having the same structure, shape, and/or function as those of the first and second embodiments are given the same drawing reference numerals and detailed descriptions are omitted.

The third embodiment can be described with reference to FIG. 17 as well as FIGS. 10 and 11.

Referring to FIGS. 10, 11, and 17, the display device 303 according to the third embodiment may comprise a substrate 200, a first assembling wiring 210, a second assembling wiring 220, a first insulating layer 215, a partition wall 207, a semiconductor light-emitting device 150, a second insulating layer 250, and an electrode wiring 260. The third embodiment may comprise more components than these, but is not limited thereto.

The first assembling wiring 210 may comprise a first bus wiring 211 and a first branch electrode 212, and the second assembling wiring 220 may comprise a second bus wiring 221 and a second branch electrode 222.

A part of the second assembling wiring 220, i.e., the second branch electrode 222, may be disposed on the upper side of a part of the first assembling wiring 210, i.e., the first branch electrode 212. For example, the second branch electrode 222 may vertically overlap the first branch electrode 212.

The width t1 of the first branch electrode 212 may be greater than the diameter D11 of the assembly hole 207H, and the width t2 of the second branch electrode 222 may be smaller than the diameter D11 of the assembly hole 207H. Accordingly, the assembly hole 207H may comprise a first hole region 207*a* where the second branch electrode 222 vertically overlaps with the first branch electrode 212, and a second hole region 207*b* where the second branch electrode 222 does not vertically overlap with the first branch electrode 212.

According to the structure of each of the first branch electrode 212, the second branch electrode 222, and the assembly hole 207H, or the arrangement relationship therebetween, a first DEP force and a second DEP force having uniform or identical strengths may be formed on both sides of the second branch electrode 222, so that the semiconductor light-emitting device 150 can be inserted into the assembly hole 207H and aligned in a normal position, and can also be fixed in a state of a normal position on the second branch electrode 222 by the first DEP force and the second DEP force.

The second branch electrode 222 may comprise a bar electrode 222*m* and an auxiliary electrode 222*a*.

The bar electrode 222*m* may be disposed along the second direction 312 across the center of the assembly hole 207H.

The auxiliary electrode 222*a* may be disposed at the center of the assembly hole 207H and may be disposed along the first direction 311, intersecting with the bar electrode 222*m*. The width t3 of the auxiliary electrode 222*a* may be greater than the width t2 of the bar electrode 222*m*.

Although the width t3 of the auxiliary electrode 222*a* is depicted as being smaller than the diameter D11 of the assembly hole 207H in the drawing, it may be greater than the diameter of the assembly hole 207H.

For example, the auxiliary electrode 222*a* may have a bar shape. For example, the auxiliary electrode 222*a* may have a polygonal shape. In the drawing, the auxiliary electrode 222*a* has a rectangular shape, but it may also have a pentagon, a hexagon, or a star shape.

For example, a cross shape may be formed by the bar electrode 222*m* and the auxiliary electrode 222*a*.

For example, the distance between the ends of the both sides of the auxiliary electrode 222*a* and the inner side of the assembly hole 207H may be smaller than the distance between the bar electrode 222*m* and the inner side of the assembly hole 207H.

For example, the bar electrode 222*m* may extend along the second direction 312 from both sides of the auxiliary electrode 222*a*. For example, the first side of the bar electrode 222*m* may extend from the first side of the auxiliary electrode 222*a* toward the second bus wiring 221. For example, the second side of the bar electrode 222*m* may extend from the second side of the auxiliary electrode 222*a* toward the first assembling wiring 210.

For another example, the auxiliary electrode 222*a* may extend along the first direction 311 from both sides of the bar electrode 222*m*. For example, the first side of the auxiliary electrode 222*a* may extend from the first side of the bar electrode 222*m* along the second direction 312, and the second side of the auxiliary electrode 222*a* may extend from the second side of the bar electrode 222*m* along the opposite direction of the second direction 312.

Since the auxiliary electrode 222*a*, which is disposed to intersect the bar electrode 222*m* at the center of the assembly hole 207H, has a polygonal shape and its width t3 is greater than the width t2 of the bar electrode 222*m*, the semiconductor light-emitting device 150, which is positioned at the center of the assembly hole 207H, can be positioned at the assembly hole 207H without shaking left and right due to the expanded contact area with the auxiliary electrode 222*a*. In addition, the contact area with the semiconductor light-emitting device 150 can be expanded by the polygonal auxiliary electrode 222*a* having a width t3 greater than the width t2 of the bar electrode 222*m*, thereby improving the electrical and optical characteristics.

According to the third embodiment, by disposing the polygonal auxiliary electrode 222*a* having a width t3 greater than the width t2 of the bar electrode 222*m* at the center of the assembly hole 207H, the semiconductor light-emitting device 150 can be positioned by preventing the semiconductor light-emitting device 150 from being tilted to one side due to left-right shaking.

Fourth Embodiment

Figure 18:
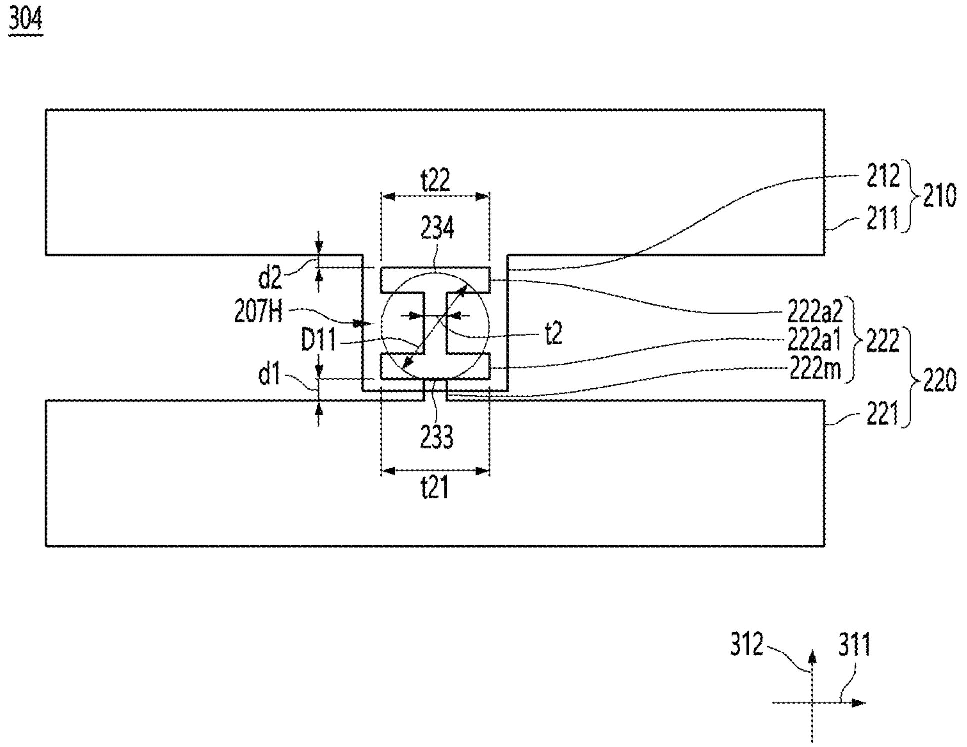
FIG. 18 is a plan view illustrating a display device according to a fourth embodiment.

FIG. 18 is a plan view illustrating a display device according to a fourth embodiment.

The fourth embodiment is the same as the first embodiment except for the first auxiliary electrode 222*a*1 and the second auxiliary electrode 222*a*2, and is similar to the second and third embodiments. In the fourth embodiment, components having the same structure, shape, and/or function as those of the first to third embodiments are given the same drawing reference numerals and detailed descriptions are omitted.

The fourth embodiment can be described with reference to not only FIG. 18 but also FIG. 10 and FIG. 11.

Referring to FIG. 10, FIG. 11, and FIG. 18, the display device 304 according to the fourth embodiment may comprise a substrate 200, a first assembling wiring 210, a second assembling wiring 220, a first insulating layer 215, a partition wall 207, a semiconductor light-emitting device 150, a second insulating layer 250, and an electrode wiring 260. The fourth embodiment may comprise more components than these, but is not limited thereto.

The first assembling wiring 210 may comprise the first bus wiring 211 and the first branch electrode 212, and the second assembling wiring 220 may comprise the second bus wiring 221 and the second branch electrode 222.

A part of the second assembling wiring 220, that is, the second branch electrode 222, may be disposed on the upper side of a part of the first assembling wiring 210, that is, the first branch electrode 212. For example, the second branch electrode 222 may vertically overlap the first branch electrode 212.

The width t1 of the first branch electrode 212 may be greater than the diameter D11 of the assembly hole 207H, and the width t2 of the second branch electrode 222 may be smaller than the diameter D11 of the assembly hole 207H. Accordingly, the assembly hole 207H may comprise a first hole region 207*a* in which the second branch electrode 222 vertically overlaps the first branch electrode 212, and a second hole region 207*b* in which the second branch electrode 222 does not vertically overlap the first branch electrode 212.

According to the structure of each of the first branch electrode 212, the second branch electrode 222, and the assembly hole 207H, or the arrangement relationship therebetween, a first DEP force and a second DEP force having uniform or identical strengths may be formed on both sides based on the second branch electrode 222, so that the semiconductor light-emitting device 150 may be inserted into the assembly hole 207H and aligned in a normal position, and may be fixed in a state of a normal position on the second branch electrode 222 by the first DEP force and the second DEP force.

The second branch electrode 222 may comprise a bar electrode 222*m*, a first auxiliary electrode 222*a*1, and a second auxiliary electrode 222*a*2.

The bar electrode 222*m* may be disposed along the second direction 312 across the center of the assembly hole 207H.

The first auxiliary electrode 222*a*1 and the second auxiliary electrode 222*a*2 may be respectively positioned below the third inner side 233 and the fourth inner side 234 facing each other in the assembly hole 207H, and can be positioned along the first direction 311 across the bar electrode 222*m*.

For example, the first auxiliary electrode 222*a*1 may be disposed below the third side 233 of the assembly hole 207H closer to the first bus wiring 211 than to the second bus wiring 221. For example, the second auxiliary electrode 222*a*2 may be disposed below the fourth side 234 of the assembly hole 207H closer to the second bus wiring 221 than to the first bus wiring 211. A part of the first auxiliary electrode 222*a*1 may be exposed by the assembly hole 207H, and another part of the first auxiliary electrode 222*a*1 may not be exposed by the partition wall 207. A part of the second auxiliary electrode 222*a*2 may be exposed by the assembly hole 207H, and another part of the first auxiliary electrode 222*a*1 may not be exposed by the partition wall 207.

The first auxiliary electrode 222*a*1 may be positioned at a first distance d1 from the second bus wiring 221 and intersect the bar electrode 222*m*, and the second auxiliary electrode 222*a*2 may be positioned at a second distance d2 from the first bus wiring 211 and intersect the bar electrode 222*m*. The first distance d1 and the second distance d2 may be the same, but there is not limited thereon.

The first auxiliary electrode 222*a*1 and the second auxiliary electrode 222*a*2 may be disposed parallel to each other. That is, the first auxiliary electrode 222*a*1 and the second auxiliary electrode 222*a*2 may be disposed along the first direction 311. The first auxiliary electrode 222*a*1 and the second auxiliary electrode 222*a*2 may be disposed parallel to the first bus wiring 211 or the second bus wiring 221, but is not limited thereon.

For example, the width t21 of the first auxiliary electrode 222*a*1 may be greater than the width t2 of the bar electrode 222*m*. For example, the width t22 of the second auxiliary electrode 222*a*2 may be greater than the width t2 of the bar electrode 222*m*. The width t21 of the first auxiliary electrode 222*a*1 and the width t22 of the second auxiliary electrode 222*a*2 may be the same, but are not limited thereto.

The width t21 of the first auxiliary electrode 222*a*1 or the width t22 of the second auxiliary electrode 222*a*2 may be smaller than the diameter D11 of the assembly hole 207H, but is not limited thereto.

Since the auxiliary electrodes disposed to intersect the bar electrode 222*m* at the third inner side 233 and the fourth inner side 234 of the assembly hole 207H have a bar shape, when the semiconductor light-emitting element 150 is positioned at the center of the assembly hole 207H, the lower surfaces on both sides of the semiconductor light-emitting element 150 may be in contact with the first auxiliary electrode 222*a*1 and the second auxiliary electrode 222*a*2. Thus, the contact area of the semiconductor light-emitting element 150 with the first and second auxiliary electrodes 222*a*2 may be expanded, so that it can be positioned at the assembly hole 207H without shaking left and right. In addition, the contact area with the semiconductor light-emitting element 150 may be expanded by the first auxiliary electrode 222*a*1 and the second auxiliary electrode 222*a*2 disposed at the third inner side 233 and the fourth inner side 234 of the assembly hole 207H, so that the electrical characteristics and optical characteristics can be improved.

According to the fourth embodiment, by disposing the first auxiliary electrode 222*a*1 and the second auxiliary electrode 222*a*2 on the third inner side 233 and the fourth inner side 234 of the assembly hole 207H, the semiconductor light-emitting device 150 can be positioned by preventing the semiconductor light-emitting device 150 from being tilted to one side due to left-right shaking.

Fifth Embodiment

Figure 19:
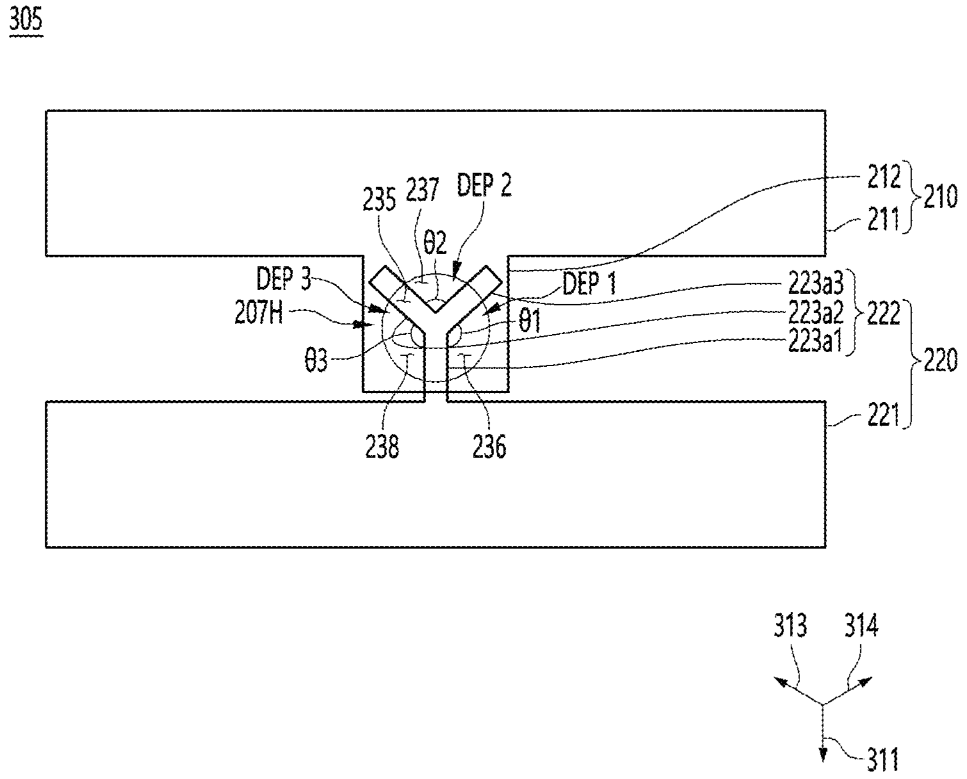
FIG. 19 is a plan view illustrating a display device according to a fifth embodiment.

FIG. 19 is a plan view illustrating a display device according to a fifth embodiment.

The fifth embodiment is similar to the first to fourth embodiments except for the first bar electrode 223*a*1, the second bar electrode 223*a*2, and the third bar electrode 223*a*3. In the fifth embodiment, components having the same structure, shape, and/or function as those in the first to fourth embodiments are given the same drawing reference numerals and detailed descriptions are omitted.

The fifth embodiment may be described with reference to FIG. 19 as well as FIG. 10 and FIG. 11.

Referring to FIG. 10, FIG. 11, and FIG. 19, the display device 305 according to the fifth embodiment may comprise a substrate 200, a first assembling wiring 210, a second assembling wiring 220, a first insulating layer 215, a partition wall 207, a semiconductor light-emitting device 150, a second insulating layer 250, and an electrode wiring 260. The fifth embodiment may comprise more components than these, but is not limited thereto.

The first assembling wiring 210 may comprise a first bus wiring 211 and a first branch electrode 212, and the second assembling wiring 220 may comprise a second bus wiring 221 and a second branch electrode 222.

A part of the second assembling wiring 220, that is, the second branch electrode 222, may be disposed on the upper side of a part of the first assembling wiring 210, that is, the first branch electrode 212. For example, the second branch electrode 222 may vertically overlap the first branch electrode 212.

The width t1 of the first branch electrode 212 may be greater than the diameter D11 of the assembly hole 207H, and the width t2 of the second branch electrode 222 may be smaller than the diameter D11 of the assembly hole 207H.

The second branch electrode 222 may comprise a first bar electrode 223*a*1, a second bar electrode 223*a*2, and a third bar electrode 223*a*3.

The first bar electrode 223*a*1, the second bar electrode 223*a*2, and the third bar electrode 223*a*3 may be disposed to extend in different directions from the center of the assembly hole 207H. The first bar electrode 223*a*1, the second bar electrode 223*a*2, and the third bar electrode 223*a*3 may be connected to each other at the center of the assembly hole 207H.

For example, the first bar electrode 223*a*1 may extend from the center of the assembly hole 207H toward the second bus wiring 221. For example, the second bar electrode 223*a*2 may extend from the center of the assembly hole 207H in the third direction 313, and the third bar electrode 223*a*3 may extend from the center of the assembly hole 207H in the fourth direction 314.

The angles θ1, θ2, and θ3 between the first bar electrode 223*a*1, the second bar electrode 223*a*2, and the third bar electrode 223*a*3 may be the same. For example, the first angle θ1 between the first bar electrode 223*a*1 and the second bar electrode 223*a*2 may be the same as the second angle θ2 between the second bar electrode 223*a*2 and the third bar electrode 223*a*3. For example, the second angle θ2 between the second bar electrode 223*a*2 and the third bar electrode 223*a*3 may be equal to the third angle θ3 between the first bar electrode 223*a*1 and the third bar electrode 223*a*3. For example, the first angle θ1, the second angle θ2, and the third angle θ3 may each be 120°, but are not limited thereto.

Meanwhile, the assembly hole 207H may comprise a first hole region 235 where the first bar electrode 223*a*1, the second bar electrode 223*a*2, and the third bar electrode 223*a*3 overlap the first branch electrode 212, and a second hole region 236 to 238 where the first bar electrode 223*a*1, the second bar electrode 223*a*2, and the third bar electrode 223*a*3 do not overlap the first branch electrode 212.

For example, the second-first hole region 236 may be a region between the first bar electrode 223*a*1 and the second bar electrode 223*a*2 where the second branch electrode 222 does not vertically overlap with the first branch electrode 212. For example, the second-second hole region 237 may be a region between the second bar electrode 223*a*2 and the third bar electrode 223*a*3 where the second branch electrode 222 does not vertically overlap with the first branch electrode 212. For example, the second-third hole region 238 may be a region between the third bar electrode 223*a*3 and the first bar electrode 223*a*1 where the second branch electrode 222 does not vertically overlap with the first branch electrode 212.

Meanwhile, a DEP force may be formed on both sides of each of the first bar electrode 223*a*1, the second bar electrode 223*a*2, and the third bar electrode 223*a*3 based on each of the first bar electrode 223*a*1, the second bar electrode 223*a*2, and the third bar electrode 223*a*3. For example, a first DEP force DEP 1 may be formed between the first bar electrode 223*a*1 and the second bar electrode 223*a*2 and the first branch electrode 212 in the second-first hole region 236. For example, a second DEP force DEP 2 may be formed between the second bar electrode 223*a*2 and the third bar electrode 223*a*3 and the first branch electrode 212 in the second-second hole region 237. For example, a third DEP force DEP 3 may be formed between the first bar electrode 223*a*1 and the third bar electrode 223*a*3 and the first branch electrode 212 in the second-third hole region 238. The value of the first DEP force DEP 1, the value of the second DEP force DEP 2, and the value of the third DEP force DEP 3 may be the same or similar.

Accordingly, the semiconductor light-emitting device 150 may be inserted into the assembly hole 207H and aligned in a normal position, and may also be fixed in a state of a normal position on the second branch electrode 222 by the first DEP force DEP 1, the second DEP force DEP 2, and the third DEP force DEP 3.

For example, the width (or length) of the second bar electrode 223*a*2 and the width (or length) of the third bar electrode 223*a*3 may be the same, but is not limited thereto.

Although the drawing shows that the end of the second bar electrode 223*a*2 and the end of the third bar electrode 223*a*3 are disposed to extend from the assembly hole 207H to below the partition wall 207, they may be disposed within the assembly hole 207H and not below the partition wall 207.

According to the fifth embodiment, when the first bar electrode 223*a*1, the second bar electrode 223*a*2, and the third bar electrode 223*a*3 are disposed to extend in different directions from the center of the assembly hole 207H, and the semiconductor light-emitting device 150 is positioned at the center of the assembly hole 207H, three areas on the lower surface of the semiconductor light-emitting device 150 may be in contact with the first bar electrode 223*a*1, the second bar electrode 223*a*2, and the third bar electrode 223*a*3, respectively, so that the contact area of the semiconductor light-emitting device 150 with the first bar electrode 223*a*1, the second bar electrode 223*a*2, and the third bar electrode 223*a*3 can be expanded, and the semiconductor light-emitting device 150 can be positioned at the assembly hole 207H without shaking left and right.

According to the fifth embodiment, the contact area with the first bar electrode 223*a*1, the second bar electrode 223*a*2, and the third bar electrode 223*a*3 can be expanded, thereby improving the electrical characteristics and optical characteristics.

The above detailed description should not be construed as limiting in all respects and should be considered illustrative. The scope of the embodiment should be determined by reasonable interpretation of the appended claims, and all changes within the equivalent range of the embodiment are included in the scope of the embodiment.

The embodiment can be adopted in the display field for displaying images or information. The embodiment can be adopted in the display field for displaying images or information using a semiconductor light-emitting device. The semiconductor light-emitting device can be a micro-level semiconductor light-emitting device or a nano-level semiconductor light-emitting device.

For example, the embodiment can be adopted in TVs, signage, smart phones, mobile phones, mobile terminals, HUDs for automobiles, backlight units for notebooks, and display devices for VR or AR.

What is claimed is:

1. A display device, comprising:

a substrate;

a first assembling wiring on the substrate;

a second assembling wiring on the first assembling wiring;

an insulating layer between the first assembling wiring and the second assembling wiring;

a partition wall disposed on the second assembling wiring and having an assembly hole; and a semiconductor light-emitting device in the assembly hole, wherein a part of the second assembling wiring is disposed at a center of the assembly hole, and wherein a width of a part of the second assembling wiring is smaller than a diameter of the assembly hole.

2. The display device according to claim 1, wherein the assembly hole comprises:

a first hole region in which the second assembling wiring vertically overlaps the first assembling wiring; and a second hole region in which the second assembling wiring does not vertically overlap the second assembling wiring.

3. The display device according to claim 2, wherein the first assembling wiring comprises:

a first bus wiring disposed along a first direction; and a first branch electrode extending from the first bus wiring along a second direction, wherein the second assembling wiring comprises:

a second bus wiring disposed along the first direction and spaced apart from the first bus wiring; and a second branch electrode extending from the second bus wiring toward the first bus wiring along the second direction.

4. The display device according to claim 3, wherein the first branch electrode and the second branch electrode are disposed in the assembly hole.

5. The display device according to claim 3, wherein the second branch electrode vertically overlaps the first branch electrode in the first hole region and does not vertically overlap the first branch electrode in the second hole region.

6. The display device according to claim 3, wherein the second branch electrode comprises a bar electrode disposed across the center of the assembly hole along the second direction.

7. The display device according to claim 6, wherein a distance between the bar electrode and a first inner side of the assembly hole and a distance between the bar electrode and a second inner side of the assembly hole are the same, and wherein the first inner side and the second inner side face each other.

8. The display device according to claim 6, wherein the second branch electrode comprises an auxiliary electrode disposed at the center of the assembly hole, having a diameter greater than a width of the bar electrode, and having a circular shape.

9. The display device according to claim 8, wherein an outer side of the auxiliary electrode has a shape corresponding to a shape of the inner side of the assembly hole.

10. The display device according to claim 6, wherein the second branch electrode comprises an auxiliary electrode disposed along the first direction by intersecting the bar electrode at the center of the assembly hole, having a width greater than a width of the bar electrode, and having a polygonal shape.

11. The display device according to claim 6, wherein the second branch electrode comprises:

a first auxiliary electrode positioned at a first distance from the second bus wiring by intersecting with the bar electrode, and having a width greater than a width of the bar electrode; and a second auxiliary electrode positioned at a second distance from the first bus wiring by intersecting with the bar electrode, and having a width greater than a width of the bar electrode.

12. The display device according to claim 11, wherein the first auxiliary electrode is positioned below a third inner side of the assembly hole, wherein the second auxiliary electrode is positioned below a fourth inner side of the assembly hole, and wherein the third inner side and the fourth inner side face each other.

13. The display device according to claim 11, wherein the first auxiliary electrode and the second auxiliary electrode are parallel to each other, and wherein the width of the first auxiliary electrode and the width of the second auxiliary electrode are the same.

14. The display device according to claim 3, wherein the second branch electrode comprises:

a first bar electrode extending from the center of the assembly hole toward the second bus wiring;

a second bar electrode extending in a third direction from the center of the assembly hole; and a third bar electrode extending in a fourth direction from the center of the assembly hole.

15. The display device according to claim 14, wherein angles between the first bar electrode, the second bar electrode, and the third bar electrode are the same.

16. The display device according to claim 14, wherein the second hole region comprises:

a second-first hole region between the first bar electrode and the second bar electrode, where the second branch electrode does not vertically overlap the first branch electrode;

a second-second hole region between the second bar electrode and the third bar electrode, where the second branch electrode does not vertically overlap with the first branch electrode; and a second-third hole region between the third bar electrode and the first bar electrode, where the second branch electrode does not vertically overlap with the first branch electrode.

17. The display device according to claim 3, wherein a width of the first branch electrode is at least greater than the diameter of the assembly hole, and wherein a width of the second branch electrode is smaller than the diameter of the assembly hole.

18. The display device according to claim 3, wherein the semiconductor light-emitting device is configured to be in touch with the second branch electrode in the first hole region, and does not contact the second branch electrode in the second hole region.

19. The display device according to claim 1, further an electrode wiring on the semiconductor light-emitting device, wherein the second assembling wiring is configured to be electrically connected to a first side of the semiconductor light-emitting device, and wherein the electrode wiring is configured to be electrically connected to a second side of the semiconductor light-emitting device.

* * * * *